(12) United States Patent
Kawakubo

(10) Patent No.: US 6,544,833 B2
(45) Date of Patent: Apr. 8, 2003

(54) SEMICONDUCTOR MEMORY DEVICE AND MANUFACTURING METHOD THEREOF

(75) Inventor: Takashi Kawakubo, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/893,664

(22) Filed: Jun. 29, 2001

(65) Prior Publication Data

US 2002/0004249 A1 Jan. 10, 2002

(30) Foreign Application Priority Data

Jun. 30, 2000 (JP) ......................................... 2000-199935

(51) Int. Cl.⁷ ......................................... H01L 21/8242
(52) U.S. Cl. ...................... 438/239; 438/212; 438/240; 438/253; 438/259; 438/268; 438/270
(58) Field of Search ................................ 438/212, 239, 438/240, 253, 259, 268, 270

(56) References Cited

U.S. PATENT DOCUMENTS

| | | | |
|---|---|---|---|
| 5,691,219 A | 11/1997 | Kawakubo et al. | |
| 5,739,563 A | 4/1998 | Kawakubo et al. | |
| 5,990,509 A | * 11/1999 | Burns, Jr. et al. | |
| 6,037,209 A | * 3/2000 | Rosner et al. | |
| 6,137,128 A | * 10/2000 | Holmes et al. | |
| 6,165,837 A | 12/2000 | Kawakubo et al. | |
| 6,172,391 B1 | * 1/2001 | Goebel et al. | |
| 6,242,298 B1 | 6/2001 | Kawakubo | |
| 6,316,309 B1 | * 11/2001 | Holmes et al. | |
| 6,391,721 B2 | * 5/2002 | Nakgawa | |
| 6,440,801 B1 | * 8/2002 | Furukawa et al. | |

FOREIGN PATENT DOCUMENTS

JP  11-74477  3/1999

* cited by examiner

*Primary Examiner*—Long Pham
(74) *Attorney, Agent, or Firm*—Oblon, Spivak, McClelland, Maier & Neustadt, P.C.

(57) ABSTRACT

A semiconductor memory device is manufactured by uniformly forming an epitaxial capacitor layer on the whole surface of a single-crystal semiconductor layer, finely dividing the capacitor layer into individual capacitors by etching, using the individual capacitors as a mask to etch the single-crystal semiconductor layer and forming semiconductor columnar portions, and preparing vertical field effect transistors each having a channel portion in the semiconductor columnar portion. Thereby, the vertical field effect transistor can be formed under the epitaxial capacitor in a self aligning manner.

8 Claims, 17 Drawing Sheets

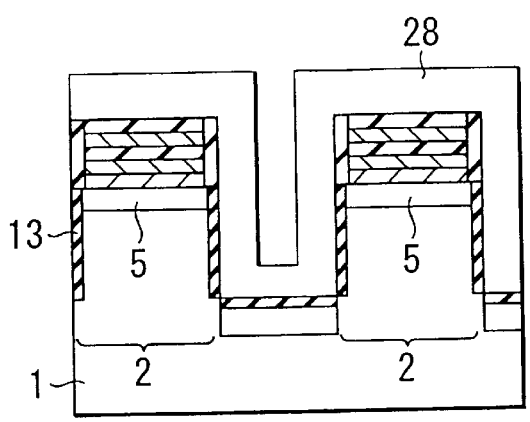
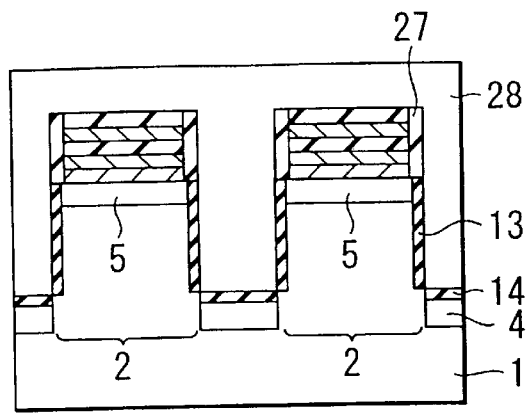
FIG. 6A          FIG. 6B
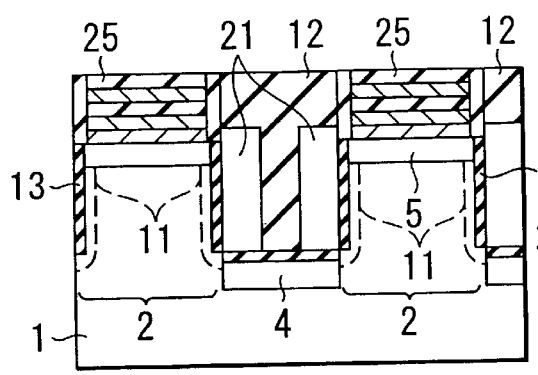
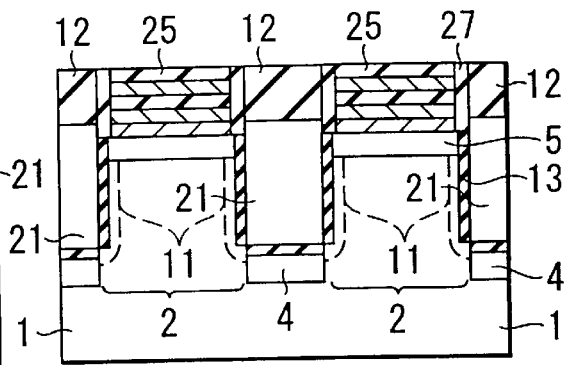
FIG. 7A          FIG. 7B
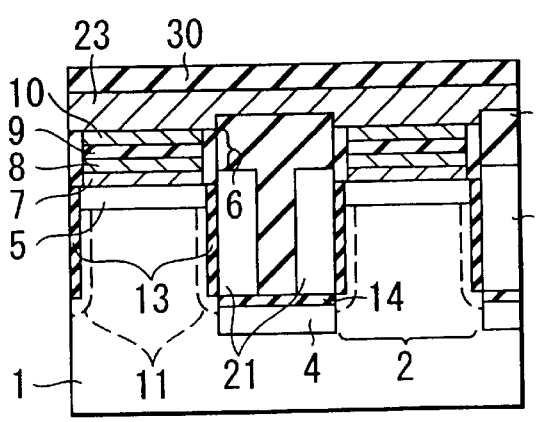
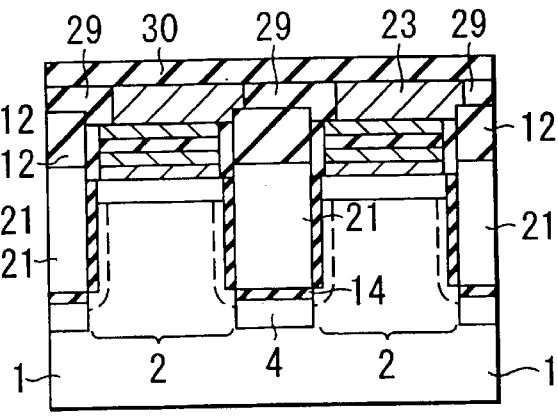
FIG. 8A          FIG. 8B

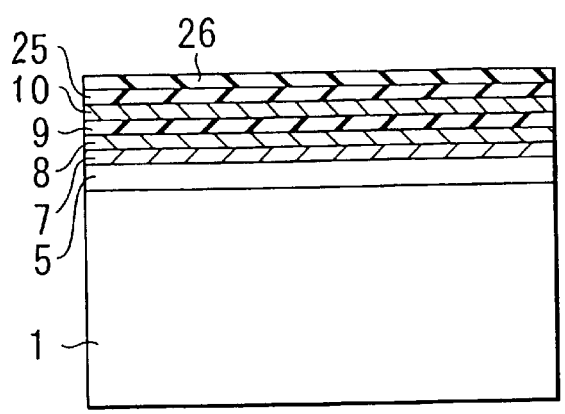 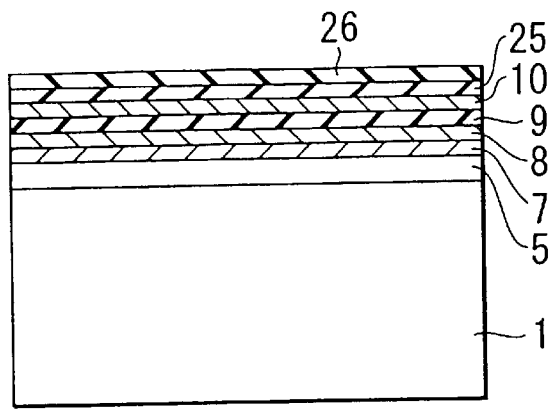
FIG. 11A  FIG. 11B
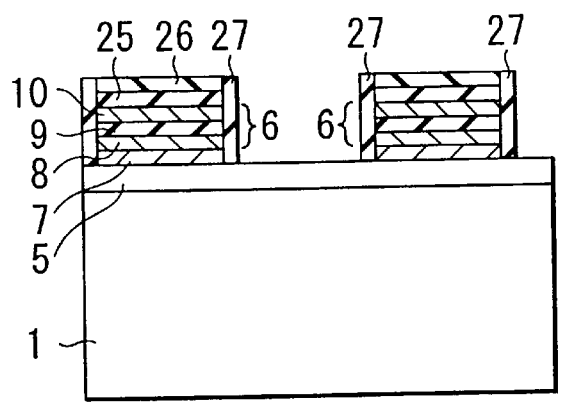 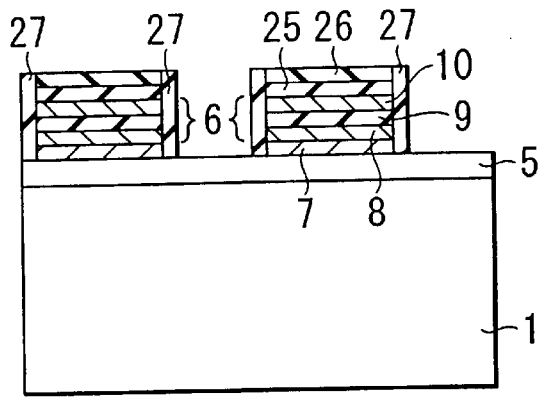
FIG. 12A  FIG. 12B
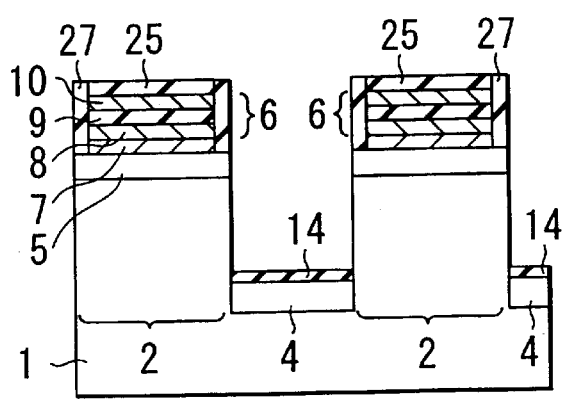 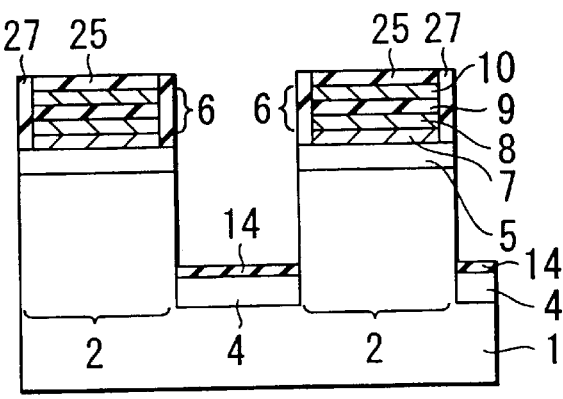
FIG. 13A  FIG. 13B

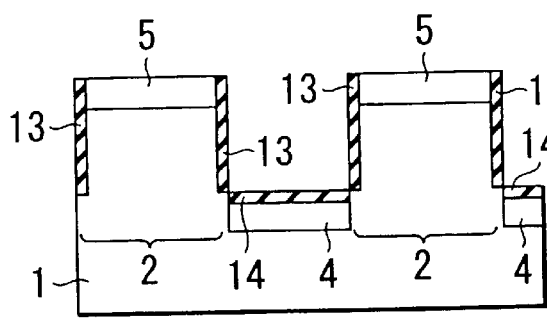
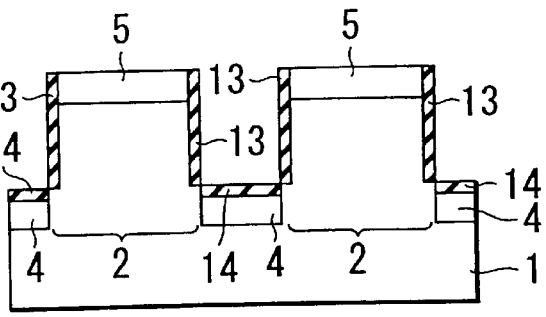
FIG. 25A  FIG. 25B
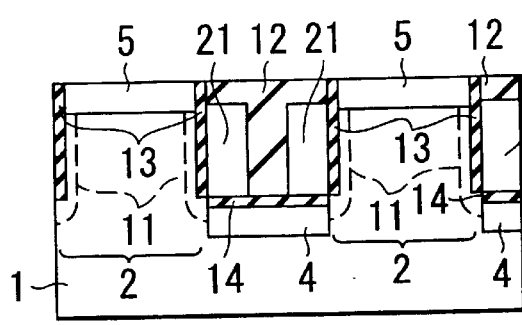
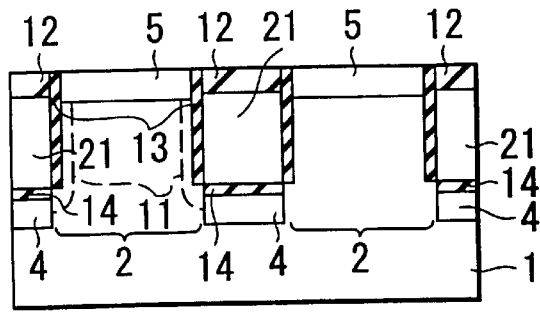
FIG. 26A  FIG. 26B
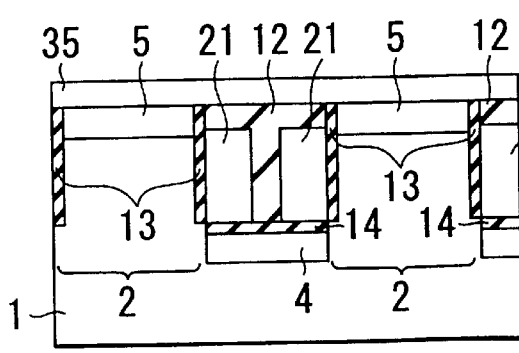
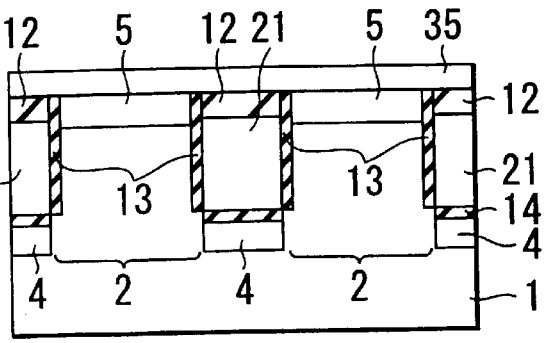
FIG. 27A  FIG. 27B

SEMICONDUCTOR MEMORY DEVICE AND MANUFACTURING METHOD THEREOF

CROSS-REFERENCE TO RELATED APPLICATIONS

This application is based upon and claims the benefit of priority from the prior Japanese Patent Application No. 2000-199935, filed Jun. 30, 2000, the entire contents of which are incorporated herein by reference.

BACKGROUND OF THE INVENTION

The present invention relates to a semiconductor memory device and a manufacturing method of the device.

In recent years, a memory device (ferroelectric memory) has been developed in which a ferroelectric film is used as a memory medium in a capacitor and a field effect transistor is used as a switching element, and has partially been brought to a practical use. The ferroelectric memory is a nonvolatile memory utilizing a phenomenon in which a ferroelectric material generates a potential difference by spontaneous polarization and keeps this state even in no voltage applied state. Even after a power is turned off, a stored content is not lost. Additionally, when the ferroelectric film is sufficiently thin, the spontaneous polarization is reversed fast, and high-speed writing/reading is possible like DRAM.

The ferroelectric memory has the aforementioned characteristics, but $Pb(Zr, Ti)O_3$ or $SrBi_2Ta_2O_7$ for general use as the ferroelectric film mainly contains low-melting-point metals such as lead and bismuth, the film is therefore unstable, and it is difficult to achieve a thin film. Another problem is that the film is deteriorated in a silicon process, and the ferroelectric memory cannot fulfill its ability.

On the other hand, the ferroelectric film of $BaTiO_3$ is stable from a viewpoint of thermodynamics, can therefore be thinned, and is not deteriorated even in the silicon process. However, since the Curie temperature thereof is low, a ferroelectric property is not constant and is insufficient.

Furthermore, when $BaTiO_3$ is epitaxially grown on an underlayer, and lattice mismatching with the underlayer is utilized to introduce strain, a very satisfactory ferroelectric property can be obtained. That is, when stable $BaTiO_3$ can be used as a ferroelectric material to form an epitaxially grown capacitor on the underlayer, an ideal ferroelectric memory can be realized.

On the other hand, for a capacitor which is used in DRAM and the like, and which mainly includes a paraelectric film such as a silicon oxide film, even when a structure is not of a single crystal, a sufficient capacitor property can be achieved. Therefore, when an interlayer insulating film is formed on a transistor formed on the surface of a semiconductor substrate, and a paraelectric capacitor can directly be formed on the interlayer insulating film in DRAM, a multilayered structure can easily be realized. Therefore, the DRAM can easily and highly be integrated.

However, the epitaxial capacitor for use in the ferroelectric memory cannot be obtained by epitaxial growth directly on the amorphous interlayer insulating film, and it is essential to utilize a single-crystal Si surface as the underlayer in some way. For example, the epitaxial capacitor can be formed in the same surface of the single-crystal Si substrate as a surface with a transistor formed thereon to constitute a memory cell. Of course, in this case, a space of an element region for one bit is twice or more the space of a multilayered structure, and this structure is unsuitable for high integration.

In consideration of the aforementioned respects, various proposals of a multilayered and highly integrated ferroelectric memory have been presented.

As one of the proposals, there is a method (U.S. Pat. No. 5,739,563) comprising: forming the interlayer insulating film for coating the transistor on the Si substrate with the transistor formed beforehand thereon; forming an opening (contact hole) in the interlayer insulating film on either a source electrode or a drain electrode of the transistor; forming a single-crystal Si storage node in the opening by selective epitaxial growth from a vapor phase or epitaxial growth of a solid phase from an amorphous structure; and subsequently forming the epitaxial capacitor on the single-crystal Si storage node by the epitaxial growth.

Since the epitaxial capacitor can be formed on the transistor by this method, the method is suitable for high integration rather than the method of forming the transistor and capacitor laterally on the same Si substrate plane. However, for a higher integration, a smaller contact hole has to be formed on either the source electrode or the drain electrode of the transistor, an aspect ratio of a contact hole depth to width increases, and it is presumed to be difficult to form silicon in a single crystal state in the contact hole.

To avoid this problem, it is proposed to utilize a silicon selective growth property such that selectivity is enhanced at a higher growth temperature and to form single-crystal silicon by higher-temperature growth. However, the substrate temperature cannot be raised to be not less than a range of 750 to 800° C. because of heat resistance of the transistor, and this limits formation of the single-crystal silicon. From this viewpoint, a growth condition for selectively and epitaxially growing the single-crystal Si storage node at a high aspect ratio is very strict. Therefore, in consideration of a yield in preparing several tens of mega or more plugs in one memory device, it is expected that a technical problem to be solved is large.

Moreover, as another preparing method, a method of attaching a first silicon substrate with the epitaxial capacitor formed thereon to a second silicon substrate with the transistor formed thereon is proposed (Japanese Patent Application Laid-Open No. 11-74477). However, when an impact applied to the transistor or the epitaxial capacitor during attachment of the substrates, precision in re-polishing the substrate, and variation of properties among bits, and the like are considered, the technical problem to be solved is also large.

BRIEF SUMMARY OF THE INVENTION

The present invention has been developed to solve the aforementioned problem, and an object thereof is to provide a manufacturing method of a semiconductor memory device in which an epitaxial capacitor can be formed on an upper source/drain region of a vertical field effect transistor in a self-aligning manner, and an inventive semiconductor memory device manufactured by this manufacturing method.

To achieve the object, according to a first aspect of the present invention, there is provided a semiconductor memory device comprising:

a substrate having a main surface;

a single-crystal semiconductor layer having a first conductivity type formed on the main surface of the substrate;

a first impurity region and a second impurity region each having a second conductivity type and formed in the single-crystal semiconductor layer, and spaced from each other in a substantially perpendicular direction to the main surface of the substrate;

a channel portion located between the first impurity region and the second impurity region;

a gate insulating film formed on a surface of the single-crystal semiconductor layer along the channel portion;

a gate electrode formed on the gate insulating film, opposite to the channel portion; and a capacitor comprising a stacked layer of a lower capacitor electrode layer, a ferroelectric film and an upper capacitor electrode layer, successively and epitaxially grown in this order on the first impurity region.

According to a second aspect of the present invention, there is provided a semiconductor memory device comprising:

a substrate having a main surface;

a single-crystal semiconductor layer formed on the main surface of the substrate;

a plurality of semiconductor columnar portions selectively formed in a surface of the single-crystal semiconductor layer;

a first impurity region formed on each top of the plurality of columnar portions;

a channel portion formed in each of the plurality of semiconductor columnar portions and adjoining to the first impurity region;

a second impurity region formed on the single-crystal semiconductor layer adjoining to a lower portion of each of the plurality of columnar portions, the first impurity region and the second impurity region constituting source and drain regions;

a gate insulating film formed on a side surface of each of the columnar portions;

a gate electrode formed on the side surface of each of the plurality of columnar portions via the gate insulating film; and a plurality of capacitors formed on the plurality of columnar portions and each comprising a stacked layer of a lower capacitor electrode layer, a ferroelectric film and an upper capacitor electrode layer successively stacked in this order and formed in a shape which agrees with a planar shape of each top of the plurality of columnar portions.

According to a third aspect of the present invention, there is provided a manufacturing method of a semiconductor memory device, comprising:

forming a first impurity region on a surface of a single-crystal semiconductor layer provided on a main surface of a substrate, to form one of source and drain regions of a vertical field effect transistor;

epitaxially growing a stacked film comprising a lower capacitor electrode layer, a ferroelectric film and an upper capacitor electrode layer in this order on the first impurity region;

patterning the lower capacitor electrode layer, the ferroelectric film and the upper capacitor electrode layer in a desired shape, to form a plurality of capacitors;

selectively removing the single-crystal semiconductor layer in such a manner that the single-crystal semiconductor layer under the plurality of capacitors remains, to form a plurality of single-crystal semiconductor columnar portions under the plurality of capacitors;

forming a second impurity region on the single-crystal semiconductor layer adjoining to a lower portion of each of the plurality of columnar portions, the second impurity region being the other of the source and drain regions of the vertical field effect transistor;

forming a gate insulating film on a sidewall of each of the plurality of columnar portions;

forming a gate electrode on the sidewall via the gate insulating film, to form the vertical field effect transistor in which the columnar portion is a channel portion.

According to a fourth aspect of the present invention, there is provided a manufacturing method of a semiconductor memory device, comprising:

forming a plurality of single-crystal semiconductor columnar portions in a substantially perpendicular direction with respect to a surface of a single-crystal semiconductor layer provided on a main surface of a substrate;

forming a gate insulating film on respective side surfaces of the plurality of columnar portions;

forming a gate electrode on the respective side surfaces of the plurality of columnar portions via the gate insulating film;

forming a first region functioning as one of a source and a drain on respective tops of the plurality of columnar portions;

forming a second region functioning as the other of the source and the drain on the single-crystal semiconductor layer adjoining to respective bottom portions of the plurality of columnar portions;

filling the plurality of columnar portions with an insulating layer, followed by flattening and exposing the respective tops of the plurality of columnar portions;

growing an epitaxial semiconductor layer using a single-crystal semiconductor surface of the first impurity region formed on the respective tops of the plurality of columnar portions;

epitaxially growing a stacked film comprising a lower capacitor electrode layer, a ferroelectric film and an upper capacitor electrode layer in this order on the epitaxial semiconductor layer; and collectively patterning the stacked film and the epitaxial semiconductor layer, to form a plurality of capacitors.

BRIEF DESCRIPTION OF THE SEVERAL VIEWS OF THE DRAWING

FIG. 1A is a plan view of four cells, FIG. 1B is a sectional view taken along line 1B—1B of FIG. 1A, and FIG. 1C is a plan view of one cell prepared in consideration of a maximum mask deviation.

FIGS. 3 to 8 (with suffixes A, B) are explanatory views showing stages of a manufacturing method of the ferroelectric memory cell according to the first embodiment, the view with the suffix A corresponds to a sectional view taken along line I—I of FIG. 2, and the view with the suffix B corresponds to a sectional view taken along line II—II of FIG. 2.

FIGS. 11 to 16 (with suffixes A, B) are explanatory views showing the stages of the manufacturing method of the ferroelectric memory cell according to the second embodiment, the view with the suffix A corresponds to a sectional view taken along line I—I of FIG. 10, and the view with the suffix B corresponds to a sectional view taken along line II—II of FIG. 10.

FIGS. 25 to 30 (with suffixes A, B) are explanatory views showing the stages of the manufacturing method of the ferroelectric memory cell according to the fourth embodiment, the view with the suffix A corresponds to a sectional view taken along line I—I of FIG. 24, and the view with the suffix B corresponds to a sectional view taken along line II—II of FIG. 24.

FIG. 35A is a plan view taken along line 35A—35A of FIG. 35B, and FIG. 35B is a sectional view taken along line 35B—35B of FIG. 35A.

DETAILED DESCRIPTION OF THE INVENTION

Prior to description of embodiments, a viewpoint of the present invention will be described. In order to form a ferroelectric memory in a stacked structure, the present inventor has noted a vertical field effect transistor having a channel layer which extends in such a manner that conduction can be obtained in a substantially vertical direction with respect to a substrate surface.

In the vertical field effect transistor, a lower source/drain region functioning as either one of a source and drain, semiconductor layer, and upper source/drain region functioning as the other one of the source and drain are formed in order from below on a semiconductor columnar portion formed on a semiconductor substrate. Moreover, a gate electrode is formed on a side surface of the semiconductor layer via a gate insulating film. In the vertical field effect transistor, a channel portion in which a current flows to the lower source/drain region from the upper source/drain region or to the upper source/drain region from the lower source/drain region, that is, in a substantially vertical direction with respect to the semiconductor substrate is disposed on the surface of the columnar portion.

In the vertical field effect transistor, the upper source/drain region formed of a single-crystal semiconductor is positioned on an upper surface of the semiconductor substrate. It is considered that the stacked structure of the ferroelectric memory can be achieved by using the single-crystal surface of the upper source/drain region as an underlayer to form an epitaxial capacitor.

Additionally, this method also has a merit that with a minimum processed size of F, a memory cell size can be reduced to a minimum cross point cell of $4F^2$. In this case, an area of the epitaxial capacitor is $F^2$ and highest integration can be achieved.

In actual, the vertical field effect transistor was formed on the semiconductor substrate, a photolithography technique was used to form the epitaxial capacitor on the upper source/drain region having single-crystal on the surface, and the ferroelectric memory was prepared.

Figure 1A:
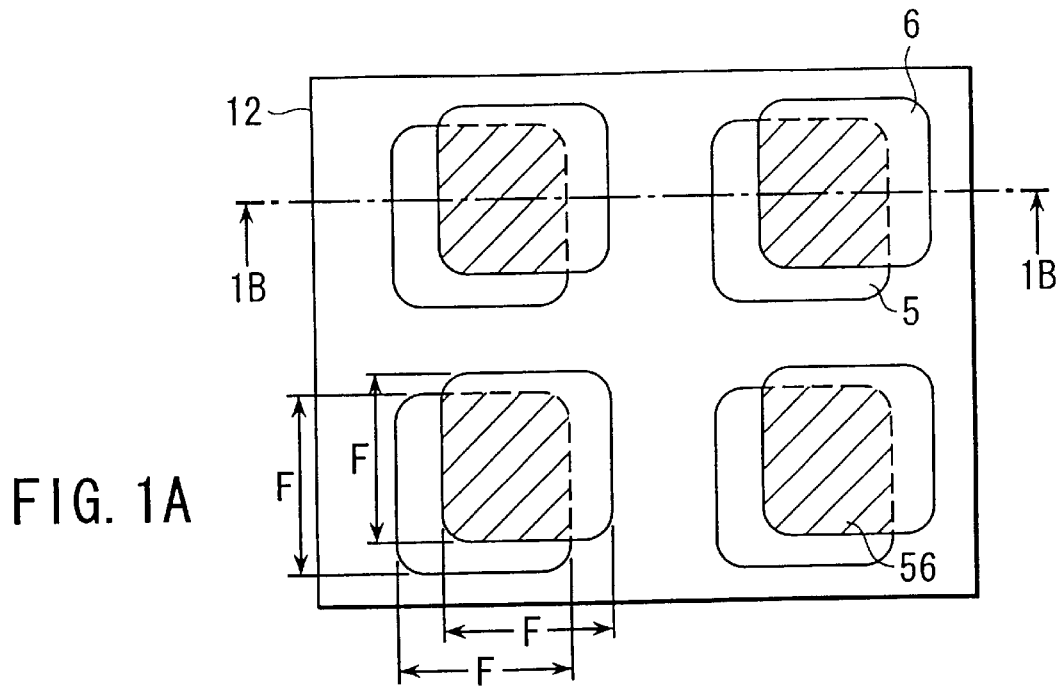
FIGS. 1A to 1C are explanatory views of an influence of mask deviation in photolithography in a ferroelectric memory in which a vertical field effect transistor is first formed and an epitaxial ferroelectric capacitor is formed on the transistor.
Figure 1B:
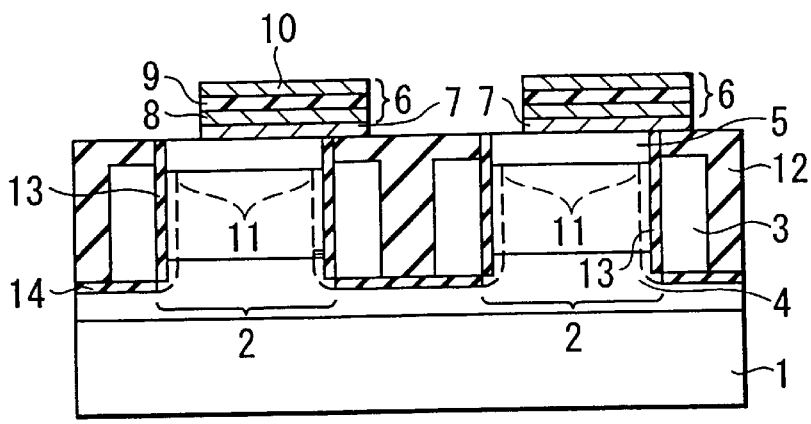
Figure 1C:
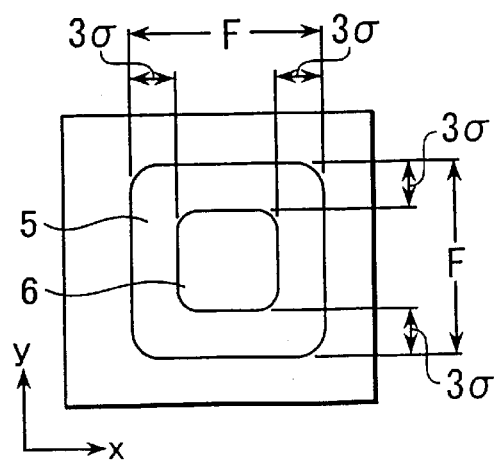

FIGS. 1A to 1C show a positional relation between the vertical field effect transistor and epitaxial capacitor of the ferroelectric memory. FIG. 1A is a plan view, and FIG. 1B is a sectional view taken along line 1B—1B of FIG. 1A.

As shown in FIGS. 1A and 1B, in the ferroelectric memory, a semiconductor columnar portion 2 is formed on an Si substrate 1. A gate electrode 3 is formed on a side surface of the columnar portion 2 via a gate insulating film 13. In the columnar portion adjacent to an interface between the columnar portion 2 and gate insulating film 13, a channel portion 11 is formed to extend in such a manner that conduction is obtained in a vertical direction with respect to the Si substrate 1. An upper source/drain region 5 functioning either one of a source and drain is formed on the columnar portion 2. Moreover, a lower source/drain region 4 functioning as the other one of the source and drain is formed under the columnar portion 2. The gate electrode 3 and lower source/drain region 4 are electrically isolated by a buried insulating film 14 (silicon oxide film). The vertical field effect transistor is constituted by the aforementioned structure, and filled with an interlayer insulating film 12 (amorphous).

A barrier layer 7 epitaxially grows on the upper source/drain region 5 having the single-crystal silicon on the surface. An epitaxial capacitor 6 of a lower capacitor electrode layer 8, ferroelectric film 9 and upper capacitor electrode layer 10 epitaxially grows on the barrier layer 7.

To prepare the ferroelectric memory, when the epitaxial capacitor 6 having an area of $F^2$ is formed on the upper source/drain region 5 having an area of $F^2$ surrounded by the amorphous interlayer insulating film 12 with a maximum aligning error of $3\sigma$, a pattern of the upper source/drain region 5 is superposed upon a pattern of the epitaxial capacitor 6 only in a region 56 hatched in FIG. 1A. Another portion in which the pattern of the capacitor 6 is not superposed upon the upper source/drain region 5 is formed on the amorphous interlayer insulating film 12. The capacitor 6 formed on the amorphous interlayer insulating film 12 is poly-crystallized without epitaxial growth of the lower capacitor electrode layer 8, ferroelectric film 9 or upper capacitor electrode layer 10.

Therefore, the capacitor property is mixture of a superior epitaxial capacitor property (region superposed upon the lower source/drain region 4) and inferior polycrystalline capacitor property (region formed on the amorphous interlayer insulating film 12). A problem occurs that remanent polarization is small and leakage current is large.

To solve the problem, as shown in FIG. 1C, the capacitor area is set to be sufficiently smaller than the area of the upper source/drain region 5 in consideration of the maximum aligning error of x and y directions, and the epitaxially grown capacitor 6 is prepared. In this case, the capacitor area is $(F-2\times3\sigma)^2$. Considering that $3\sigma$ denotes about 30%, only about 20% of the original area of $F^2$ can be utilized, and area utilization efficiency is remarkably deteriorated.

The present invention has been developed to solve the problem, and the embodiments of the present invention will be described hereinafter with reference to the drawings.

First Embodiment

Figure 2:
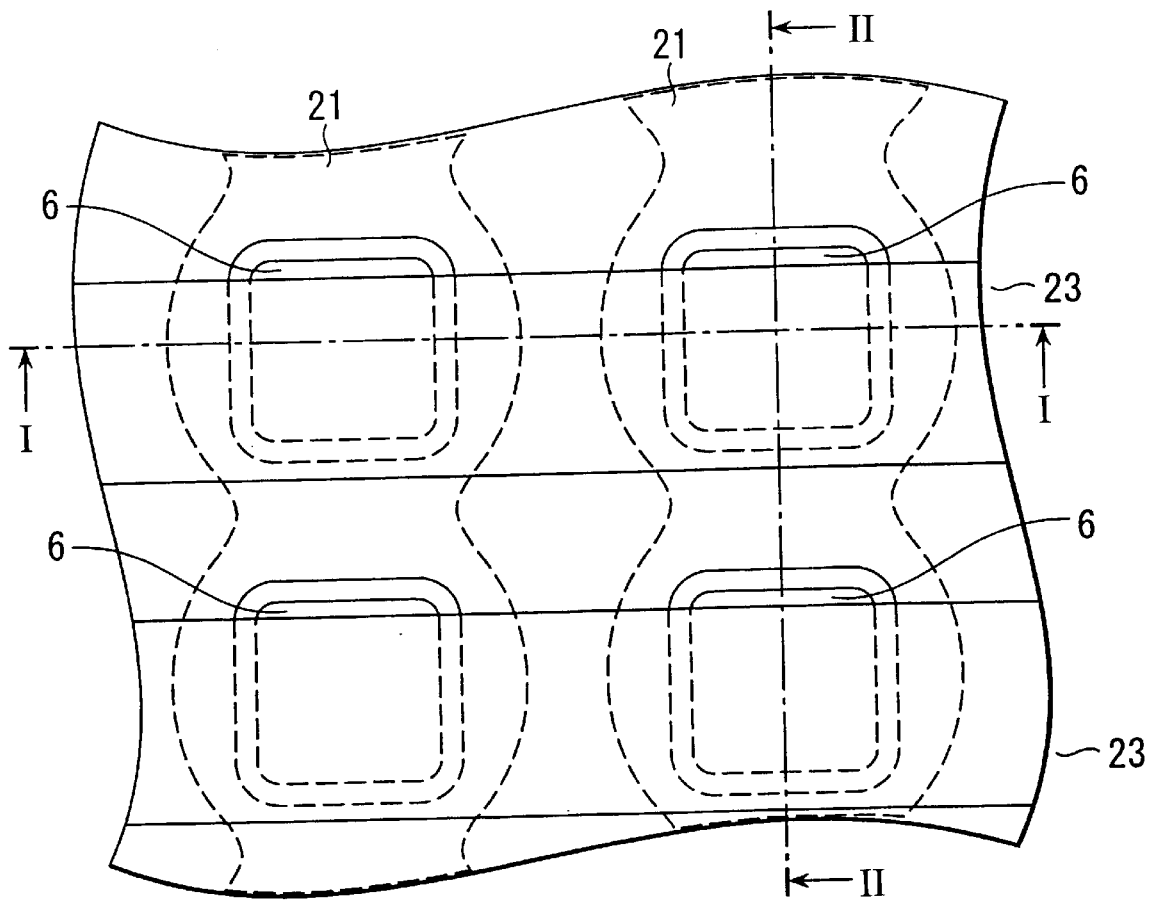
FIG. 2 is a plan view showing four cells of a ferroelectric memory according to a first embodiment of the present invention.

FIG. 2 is a plan view of a semiconductor memory device according to a first embodiment of the present invention. Here, only 2×2 memory cells are shown in which the ferroelectric capacitor and vertical field effect transistor are used.

In FIG. 2, reference numeral 21 denotes a word line and 23 denotes a bit line crossing at a substantially right angle to the word line 21. In an intersection position of the word line 21 and bit line 23, the epitaxial capacitor 6 is formed and the vertical field effect transistor is also formed under the capacitor.

A manufacturing method of the semiconductor memory device will next be described with reference to FIGS. 3 to 8 (with suffixes A, B). In FIGS. 3 to 8, the view with the suffix A corresponds to a sectional view taken along line I—I of FIG. 2, and the view with the suffix B corresponds to a sectional view taken along line II—II of FIG. 2.

Figure 3A:
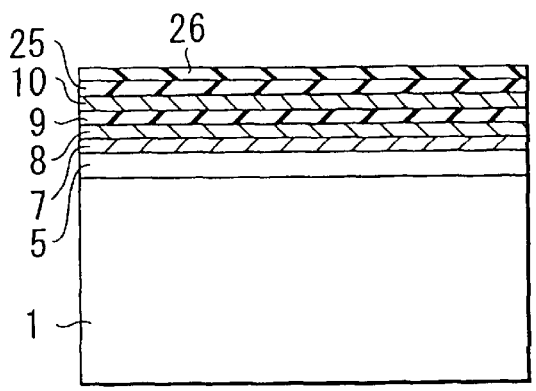
Figure 3B:
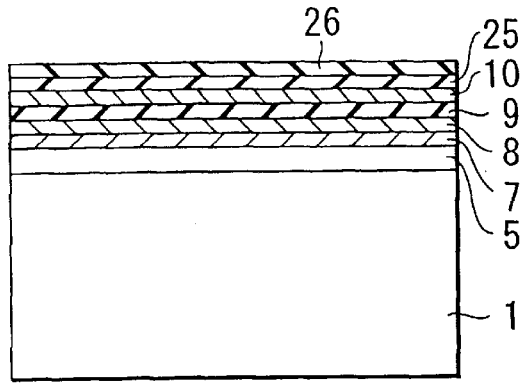

First, as shown in FIGS. 3A and 3B, immediately after using hydrofluoric acid to etch the silicon single-crystal substrate 1 with a second conductivity type impurity region 5 (later forming the upper source/drain region of the vertical field effect transistor) formed beforehand thereon, the substrate surface is cleaned with deoxygenated ultra high purity water and subjected to hydrogen termination.

Subsequently, the barrier layer 7 of $(Ti_{0.9}, Al_{0.1})N$, lower capacitor electrode layer 8 of $SrRuO_3$, ferroelectric film 9 of $BaTiO_3$, and upper capacitor electrode layer 10 of $SrRuO_3$ are epitaxially grown in order on the second conductivity type impurity region 5 by a sputtering method. In any case a substrate temperature is 600° C. Subsequently, a silicon oxide film 25 and silicon nitride film 26 are formed on the upper capacitor electrode layer 10 by a chemical vapor deposition (CVD) process.

As described above, the epitaxially grown barrier layer is preferably formed between the impurity region 5 and the lower capacitor electrode layer 8. Since the barrier layer for blocking oxygen is formed to prevent the surface of the impurity region 5 from being oxidized, the surface of the impurity region 5 is prevented from being insulated, and the capacitor can easily epitaxially grow. As the barrier layer, a conductive and cubic layer is preferable.

Figure 4A:
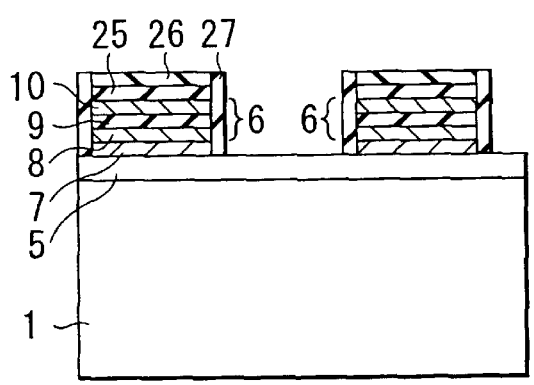
Figure 4B:
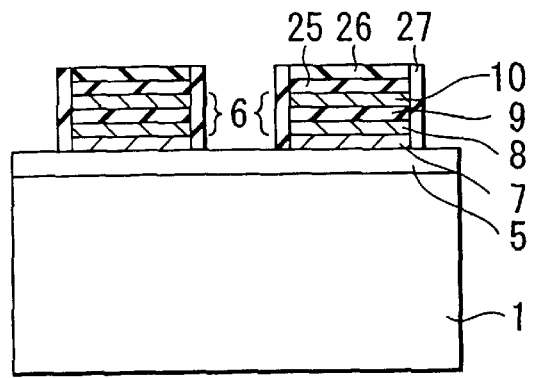

Subsequently, as shown in FIGS. 4A and 4B, by lithography and reactive ion etching (RIE), the barrier layer 7, lower capacitor electrode layer 8, ferroelectric film 9, upper capacitor electrode layer 10, silicon oxide film 25, and silicon nitride film 26 are patterned to the impurity region 5 on the semiconductor substrate 1, and individual epitaxial capacitors 6 are formed. In this case, an interval between the capacitors 6 is set to a minimum processed size F or more in the section of FIG. 4A, and the interval is set to F in the section of FIG. 4B.

Subsequently, after forming the silicon oxide film by the CVD process, the silicon nitride film 26 and impurity region 5 on the semiconductor substrate 1 are used as a stop layer and anisotropic etching is performed so that a capacitor sidewall insulator 27 of a silicon oxide film is formed on a sidewall of the epitaxial capacitor 6.

Figure 5A:
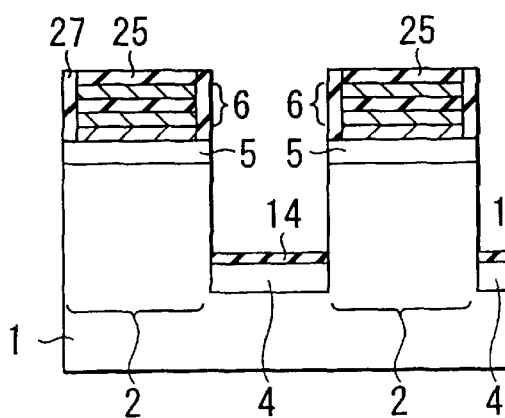
Figure 5B:
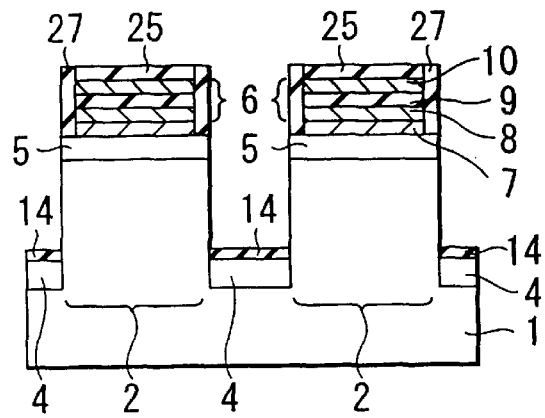

Subsequently, as shown in FIGS. 5A and 5B, the silicon oxide film 25 and capacitor sidewall silicon oxide film 27 with which the individual capacitors 6 are coated are used as a mask, the silicon substrate 1 is etched, and the semiconductor columnar portion 2 is formed. At this time the silicon nitride film 26 is also etched. Since the capacitor sidewall oxide film 27 is formed, an influence due to the etching onto the epitaxial capacitor can be suppressed.

Subsequently, ion implantation is performed using the silicon oxide film 25 and capacitor sidewall oxide film 27 including the epitaxial capacitor 6 as the mask, and activation is performed by heat treatment. The second conductivity type impurity layer 4 (later forming the lower source/drain region of the vertical field effect transistor) is thereby formed, and a buried insulating film 14 (silicon oxide film) is formed on the impurity layer 4.

Subsequently, as shown in FIGS. 6A and 6B, a sacrificial oxide film is formed on the sidewall of the semiconductor columnar portion 2 with silicon appearing thereon in an oxygen or water vapor atmosphere at 1050° C. by rapid thermal oxidation (RTO). The film is etched and removed with hydrofluoric acid, and a process-damaged layer present on the surface of the transistor channel layer is thereby removed. Thereafter, the gate insulating film 13 is formed anew by BOX (burn oxidation) at 800° C. Subsequently, a second conductivity type semiconductor layer 28 is uniformly formed on the silicon substrate 1 by the CVD process.

Subsequently, as shown in FIGS. 7A and 7B, the second conductivity type semiconductor layer 28 is anisotropically etched back to form the word line 21 (gate electrode of the vertical field effect transistor).

Additionally, in the section of FIG. 7A, since the interval between the memory cells is set to be slightly larger than the minimum processed size F, the word line 21 is horizontally divided into two. On the other hand, for the word line 21 shown in FIG. 7B, since the interval between the memory cells is set to the minimum processed size F, a groove between the semiconductor columnar portions 2 is completely filled and the word line 21 is integrally formed without being separated. Subsequently, the interlayer insulating film 12 of the silicon nitride film is buried and flattened in the whole substrate surface.

In this process, the vertical field effect transistor is formed comprising: the second conductivity type impurity layer 5 (upper source/drain region) formed on the surface of the silicon substrate 1; second conductivity type impurity layer 4 (lower source/drain region 3) formed in the lower portion of the semiconductor columnar portion 2; and gate electrode 21 formed on the sidewall of the semiconductor columnar portion 2 via the gate insulating film 13. The channel portion 11 extending in the substantially vertical direction to the silicon substrate 1 is formed in the sidewall of the semiconductor columnar portion 2 in the vertical field effect transistor. Additionally, the buried insulating film 14 electrically separates the gate electrode 21 from the lower source/drain region 4.

Subsequently, as shown in FIGS. 8A and 8B, a silicon oxide film 29 is formed on the substrate by the CVD process, and the mask for forming the bit line 23 is formed by lithography. Moreover, the silicon nitride film 12 is used as a stopper to selectively etch a part of the silicon oxide films 25 and 27, and the upper capacitor electrode layer of the epitaxial capacitor 6 is exposed. Subsequently, the bit line 23 is buried and flattened by sputtering, and a silicon oxide film 30 is then formed.

In this manner, the ferroelectric memory can be prepared, which comprises: the vertical field effect transistor including the channel portion 11 extending in the substantially vertical direction to the main surface of the silicon substrate 1, gate electrode 21 formed on the channel portion via the gate insulating film 13, and upper and lower source/drain regions 5 and 4 formed above and below the channel portion 11; and the epitaxial capacitor 6 including the lower capacitor electrode layer 8, ferroelectric film 9 and upper capacitor electrode layer 10 epitaxially grown on the upper source/drain region 5 of the vertical field effect transistor.

In the present invention, the ferroelectric capacitor is first epitaxially grown on the surface of the single-crystal semiconductor layer, and the epitaxial capacitor having the desired capacitor property is formed. Then, the epitaxial capacitor is used as the mask to etch the single-crystal semiconductor layer, and the semiconductor columnar portion is formed. The vertical field effect transistor including the channel portion is formed on the side surface of the columnar portion. In this case, since the source/drain region of the vertical field effect transistor, and the epitaxial capacitor can be positioned in a self-aligning manner, a highly integrated semiconductor memory can be prepared. That is, when all line and space processed sizes are set to the minimum processed size F, the epitaxial capacitor having the area of $F^2$ can be formed on the vertical field effect transistor having the same area of $F^2$. Therefore, high integration of the ferroelectric memory is enabled.

Moreover, in the first embodiment, the memory cell in which the epitaxial capacitor and vertical field effect transistor are self-aligned can be formed by one lithography process. That is, since the epitaxial capacitor can be used as the mask to pattern the semiconductor columnar portion and the vertical field effect transistor can be formed, the number of lithography processes is minimized. Furthermore, the memory cell can be connected to the bit line by one lithography process.

Figure 9A:
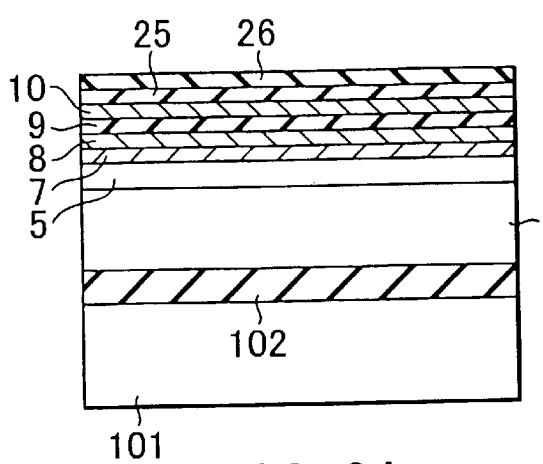
FIGS. 9A and 9B are explanatory views of an example in which an SOI substrate is used in the first embodiment, and sectional views corresponding to FIGS. 3A and 3B.
Figure 9B:
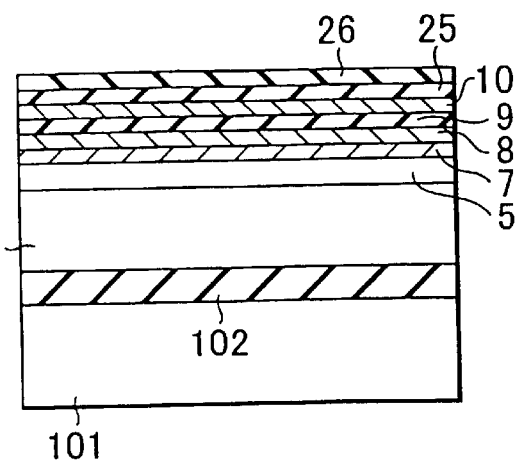

In the first embodiment, the silicon single-crystal substrate having the silicon single crystal on the surface thereof was used as the substrate which has the single-crystal semiconductor layer on one main surface. However, as shown in FIGS. 9A and 9B, a so-called SOI substrate may be used in which the silicon single-crystal layer 1 is formed on a substrate 101 via an insulating film 102. FIGS. 9A and 9B correspond to FIGS. 3A and 3B.

Second Embodiment

Figure 10:
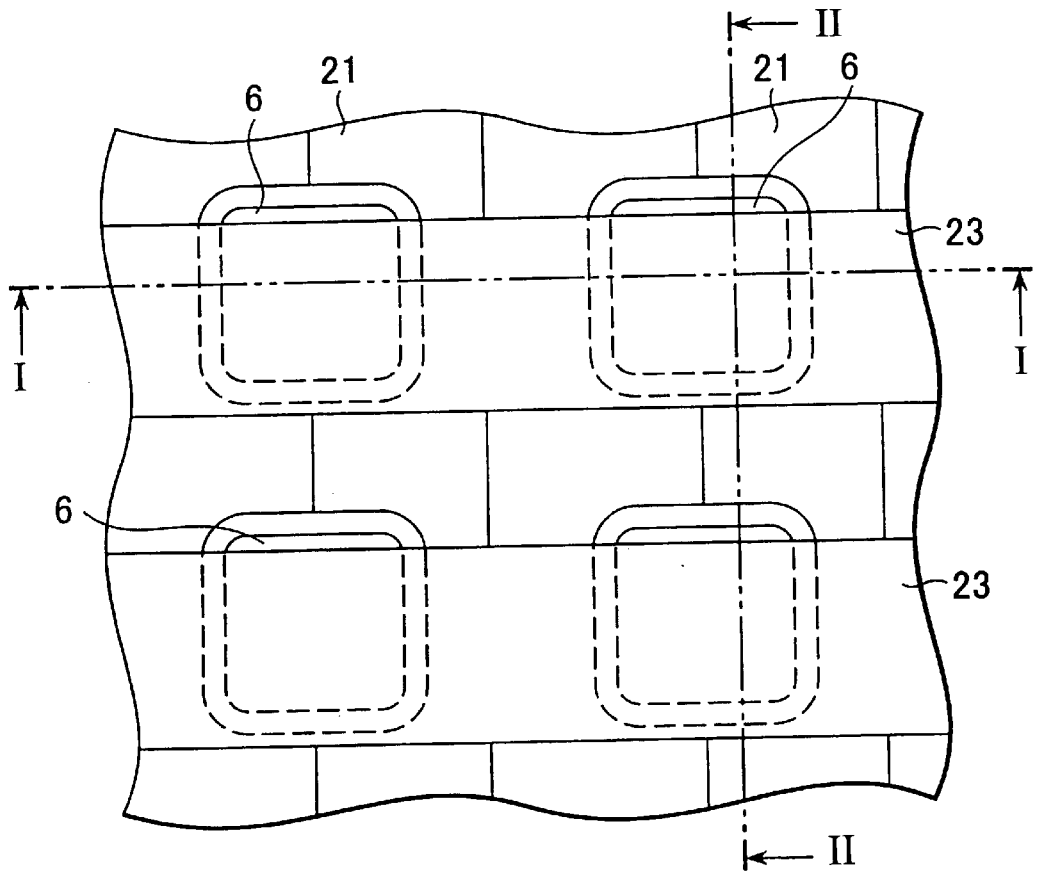
FIG. 10 is a plan view showing four cells of the ferroelectric memory according to a second embodiment of the present invention.
Figure 14A:
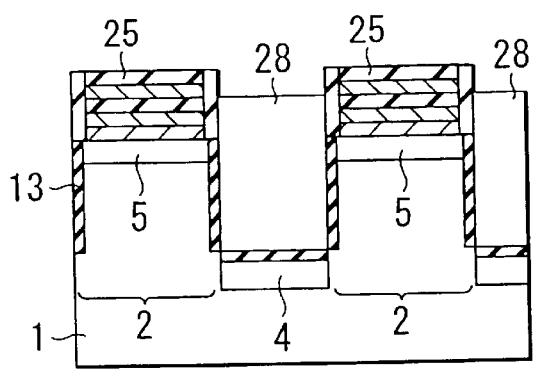
Figure 14B:
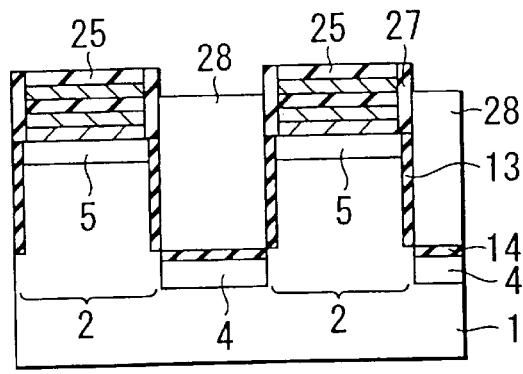

FIG. 10 is a plan view of the semiconductor memory device according to a second embodiment of the present invention. Here, only 2×2 memory cells are shown in which the ferroelectric capacitor and vertical field effect transistor are used. The second embodiment is different from the first embodiment in that the word line 21 is formed to surround a right half periphery of the vertical field effect transistor in FIG. 10. Additionally, the same portion as that of the first embodiment is denoted with the same reference numeral. This also applies to the subsequent embodiments. In the intersection position of the word line 21 and bit line 23, the ferroelectric epitaxial capacitor 6 is formed and the vertical field effect transistor is formed under the capacitor.

A manufacturing method of the semiconductor memory device will next be described with FIGS. 11 to 16 (with suffixes A, B). In FIGS. 11 to 16, the view with the suffix A corresponds to a sectional view taken along line I—I of FIG. 10, and the view with the suffix B corresponds to a sectional view taken along line II—II of FIG. 10.

The process of FIGS. 11 to 14 (with the suffixes A, B) is performed similarly as the process of FIGS. 3 to 5 (with the suffixes A, B) of the first embodiment. Additionally, in FIGS. 12A and 12B, any interval between the capacitors 6 is set to the minimum processed size F. Therefore, in the process shown in FIGS. 14A and 14B, the second conductivity type semiconductor layer 28 deposited on the whole surface of the substrate by the CVD process does not form a concave portion in a middle of a trench in FIG. 14A similarly as FIG. 14B. Thereafter, the upper surface of the semiconductor layer 28 is etched back to a position which is lower than the upper surface of the silicon oxide film 25 (FIGS. 14A and 14B).

Subsequently, the word line forming mask (not shown) is formed by the photolithography process, the silicon oxide film 25 and capacitor sidewall oxide film 27 are used as the etching stopper, the second conductivity type semiconductor layer 28 is etched back, and the word line 21 (gate electrode of the vertical field effect transistor) is formed. Subsequently, the interlayer insulating film 12 formed of the silicon nitride film is buried and flattened on the whole surface of the substrate (FIGS. 15A and 15B).

In this process, the vertical field effect transistor is formed comprising: the second conductivity type impurity layer 5 (upper source/drain region) formed on the surface of the silicon substrate 1; second conductivity type impurity layer 4 (lower source/drain region) formed in the lower portion of the semiconductor columnar portion 2; and gate electrode 21 formed on the sidewall of the semiconductor columnar portion 2 via the gate insulating film 13. The channel portion 11 extending in the substantially vertical direction to the silicon substrate 1 is formed in the sidewall of the columnar portion 2 in the semiconductor of the vertical field effect transistor. Additionally, the buried insulating film 14 electrically separates the gate electrode 21 from the lower source/drain region 4.

Figure 15A:
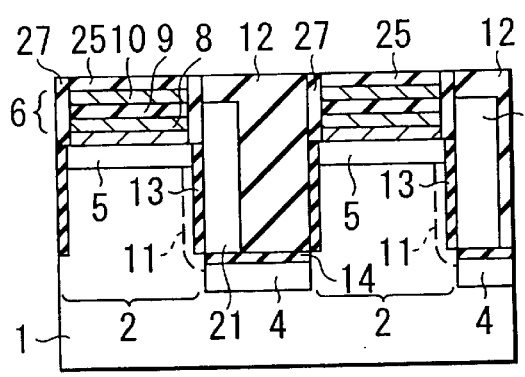
Figure 15B:
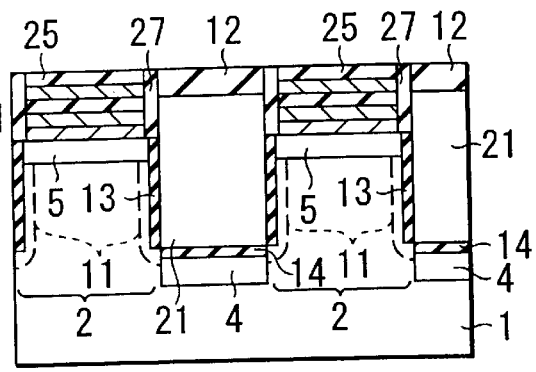

In the second embodiment, as shown in FIGS. 10 and 15A, since the gate electrode 21 is formed only on the right sidewall surface of the semiconductor columnar portion 2, the channel portion 11 is formed only in the right-side surface of the columnar portion 2.

Figure 16A:
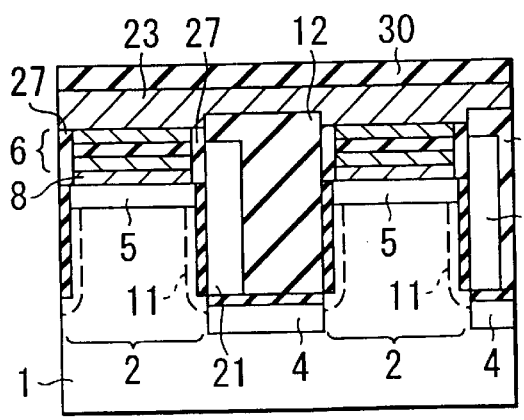
Figure 16B:
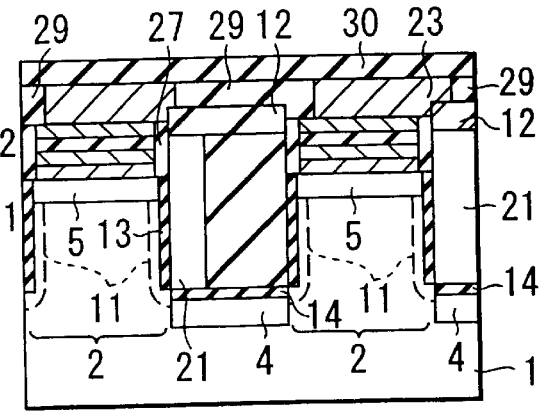

Subsequently, the silicon oxide film 29 is formed on the surface by the CVD process, the mask for forming the bit line 23 is formed by lithography, the silicon nitride film 12 is used as the stopper, a part of the silicon oxide film 25 and capacitor sidewall oxide film 27 is selectively etched, and the upper capacitor electrode layer 10 of the epitaxial capacitor 6 is exposed. Subsequently, the bit line 23 is buried by sputtering, and flattened and subsequently the silicon oxide film protective layer 30 is further formed (FIGS. 16A and 16B).

In this manner, the ferroelectric memory can be prepared which comprises: the vertical field effect transistor including the channel portion 11 extending in the substantially vertical direction to the surface of the silicon substrate 1, gate electrode 21 formed on the channel portion via the gate insulating film 13, and upper and lower source/drain regions 5 and 4 formed above and below the channel portion 11; and the epitaxial capacitor 6 including the lower capacitor electrode layer 8, ferroelectric film 9 and upper capacitor electrode layer 10 epitaxially grown on the upper source/drain region 5 of the vertical field effect transistor.

In the second embodiment, the memory cell in which the epitaxial capacitor and vertical field effect transistor are self-aligned can be formed by two lithography processes. Moreover, the memory cell can be connected to the bit line by one lithography process. Furthermore, an effect similar to that of the first embodiment can be produced.

Third Embodiment

Figure 17:
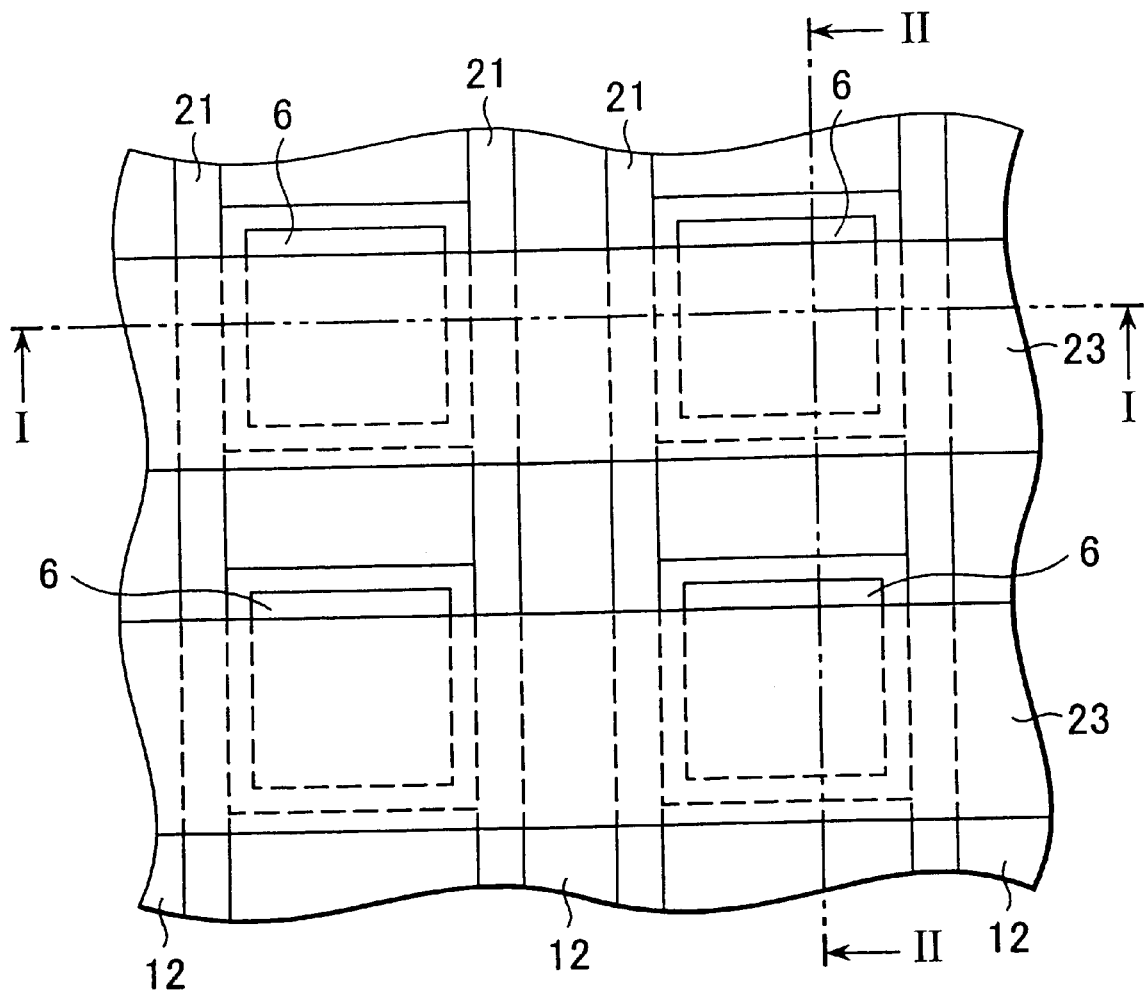
FIG. 17 is a plan view showing four cells of the ferroelectric memory according to a third embodiment of the present invention.

FIG. 17 is a plan view of the semiconductor memory device according to a third embodiment of the present invention. Here, only 2×2 memory cells are shown in which the ferroelectric capacitor and vertical field effect transistor are used. The third embodiment is different from the first embodiment in that the word line 21 is left on left and right sidewalls of the semiconductor columnar portion 2 by selective etching.

In FIG. 17, in the intersection position of the word line 21 and bit line 23, the ferroelectric epitaxial capacitor 6 is formed and the vertical field effect transistor is formed under the capacitor. Reference numeral 12 denotes the interlayer insulating film.

A manufacturing method of the semiconductor memory device will next be described with reference to FIGS. 18 to 23 (with suffixes A, B). In FIGS. 18 to 23, the view with the suffix A corresponds to a sectional view taken along line I—I of FIG. 17, and the view with the suffix B corresponds to a sectional view taken along line II—II of FIG. 17.

Figure 18A:
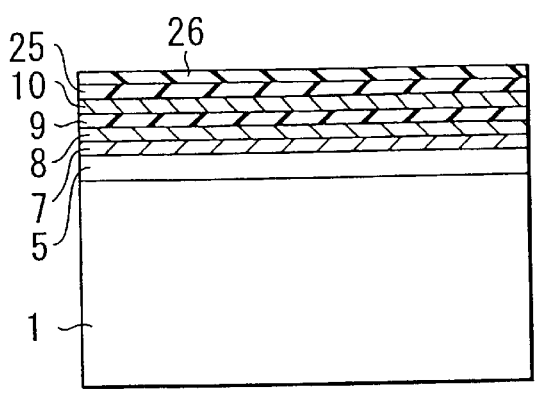
FIGS. 18 to 23 (with suffixes A, B) are explanatory views showing the stages of the manufacturing method of the ferroelectric memory cell according to the third embodiment, the view with the suffix A corresponds to a sectional view taken along line I—I of FIG. 17, and the view with the suffix B corresponds to a sectional view taken along line II—II of FIG. 17.
Figure 18B:
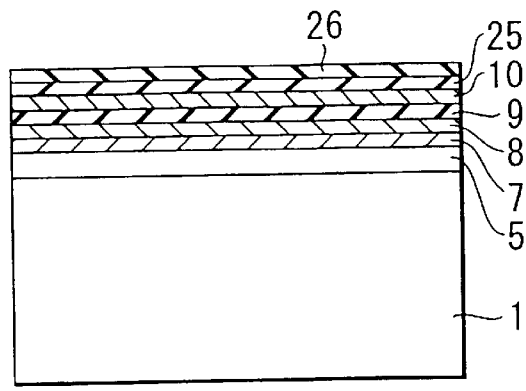

First, similarly as FIGS. 3A and 3B of the first embodiment, the barrier layer 7, lower capacitor electrode layer 8, ferroelectric film 9, and upper capacitor electrode layer 10 are epitaxially grown in order on the first conductivity type silicon single-crystal substrate 1 with the second conductivity type impurity region 5 formed beforehand on the surface thereof by the sputtering process. The silicon oxide film 25 and silicon nitride film 26 are formed on the upper capacitor electrode layer 10 by the CVD process (FIGS. 18A and 18B).

Figure 19A:
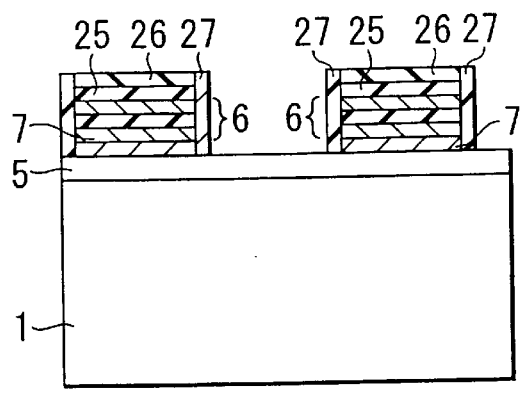
Figure 19B:
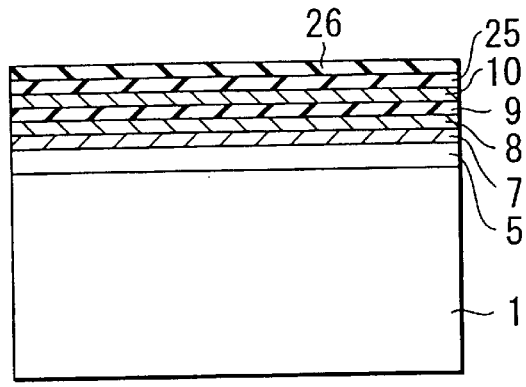

Subsequently, by the lithography and reactive ion etching, the barrier layer 7, lower capacitor electrode layer 8, ferroelectric film 9, upper capacitor electrode layer 10, silicon oxide film 25, and silicon nitride film 26 are patterned to the impurity region 5 on the semiconductor substrate 1, and the individual epitaxial capacitors 6 are formed. In this case, the etching is performed so that the capacitor 6 is left only in the section shown in FIG. 18A, that is, in the direction of the word line 21 (FIGS. 19A and 19B).

Subsequently, after forming the silicon oxide film by the CVD process, the silicon nitride film 26 and impurity region 5 on the semiconductor substrate 1 are used as the stop layer and anisotropic etching is performed, so that the capacitor sidewall oxide film 27 is formed on the sidewall of the epitaxial capacitor 6.

Subsequently, the silicon oxide film 25 and capacitor sidewall silicon oxide film 27 including the individual epitaxial capacitors 6 are used as the mask, the silicon substrate 1 is etched, and the semiconductor columnar portion 2 is formed. At this time the silicon nitride film 26 is also etched. The capacitor sidewall oxide film 27 can suppress an influence onto the epitaxial capacitor during the etching.

Subsequently, ion implantation is performed using the silicon oxide film 25 and capacitor sidewall oxide film 27 including the epitaxial capacitor 6 as the mask, and the activation is performed by heat treatment. The second conductivity type impurity diffused layer 4 (later forming the lower source/drain region of the vertical field effect transistor) is thereby formed, and the buried insulating film 14 (silicon oxide film) is formed on the impurity layer 4.

Figure 20A:
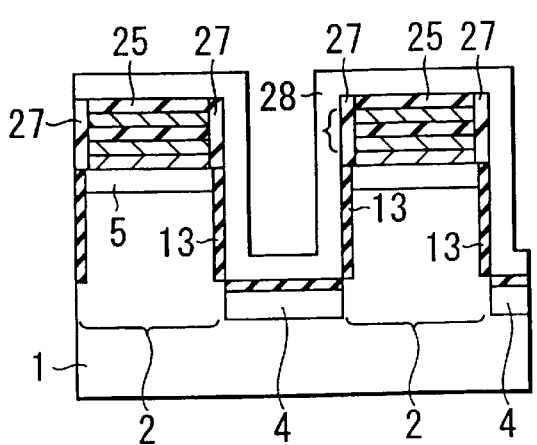
Figure 20B:
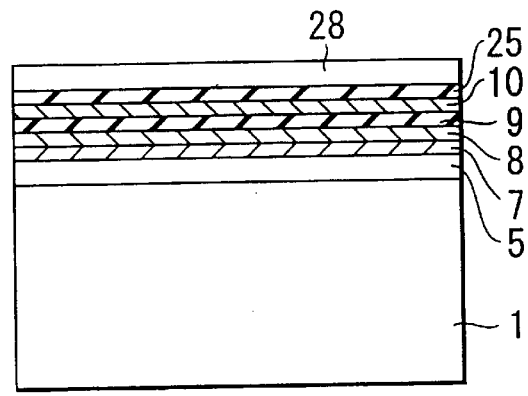

Subsequently, the sacrificial oxide film is formed on the sidewall of the semiconductor columnar portion 2 with Si appearing thereon in the oxygen or water vapor atmosphere at 1050° C. by RTO. The film is etched and removed with hydrofluoric acid, and the process-damaged layer present on the surface of the transistor channel layer is thereby removed. Thereafter, the gate insulating film 13 is formed anew by BOX at 800° C. Subsequently, the second conductivity type semiconductor layer 28 is uniformly formed on the silicon substrate 1 by the CVD process (FIGS. 20A and 20B).

Figure 21A:
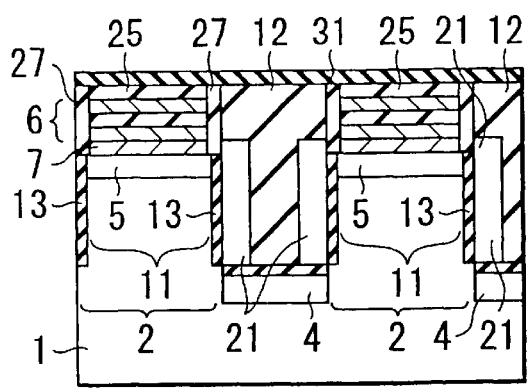
Figure 21B:
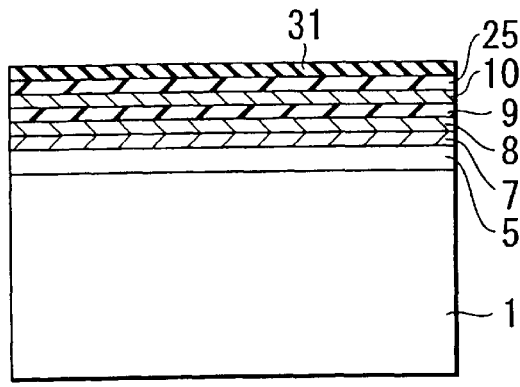

Subsequently, the silicon oxide film 25 and capacitor sidewall oxide film 27 are used as the stopper. The second conductivity type semiconductor layer 28 is anisotropically and selectively etched to form the word line 21 (gate electrode of the vertical field effect transistor). Subsequently, the interlayer insulating film 12 formed of the silicon nitride film is buried and flattened in the whole surface of the silicon substrate 1, and a silicon nitride film 31 is further formed by the CVD process (FIGS. 21A and 21B).

In this process, the vertical field effect transistor is formed comprising: the second conductivity type impurity diffused layer 5 (upper source/drain region) formed on the surface of the silicon substrate 1; second conductivity type impurity diffused layer 4 (lower source/drain region) formed in the lower portion of the semiconductor columnar portion 2; and gate electrode 21 formed on the sidewall of the semiconductor columnar portion 2 via the gate insulating film 13. The channel portion 11 in which conduction of the vertical direction to the silicon substrate 1 is obtained is formed in the sidewall of the columnar portion 2 of the semiconductor in the vertical field effect transistor. Additionally, the buried insulating film 14 electrically separates the gate electrode 21 from the lower source/drain region 4.

Subsequently, the epitaxial capacitor 6 is etched to the impurity region 5 along the bit line 23 direction by the lithography and reactive ion etching. Furthermore, after forming the silicon oxide film by the CVD process, the silicon nitride film 31 and impurity region 5 on the semiconductor substrate 1 are used as the stop layer, and a capacitor sidewall silicon oxide film 32 is formed by anisotropic etching. At this time the silicon nitride film 31 is also etched. The capacitor sidewall oxide film 27 can suppress the influence onto the epitaxial capacitor during the etching.

Figure 22A:
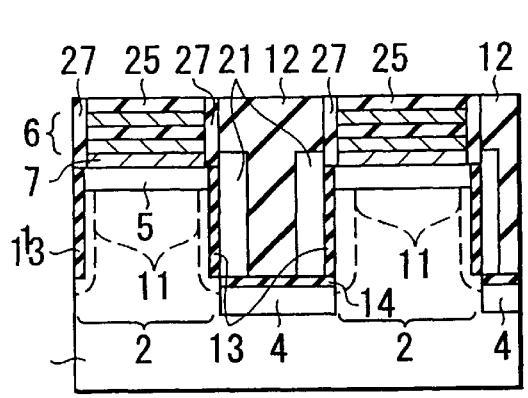
Figure 22B:
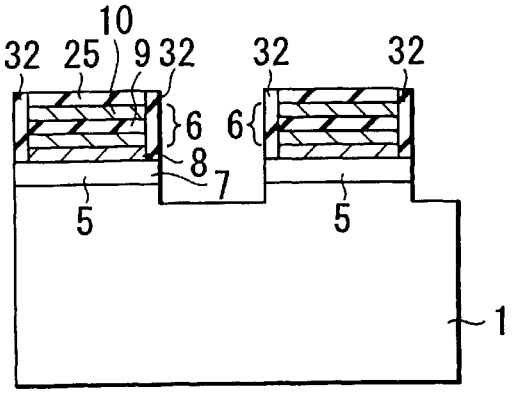

Subsequently, the silicon oxide film 25 and capacitor sidewall oxide films 27, 32 remaining on the epitaxial capacitor 6 are used as the mask, the semiconductor substrate 1 is etched, the trench is formed in a bit line 23 direction, and the epitaxial capacitor 6 is separated (FIG. 22B).

Figure 23A:
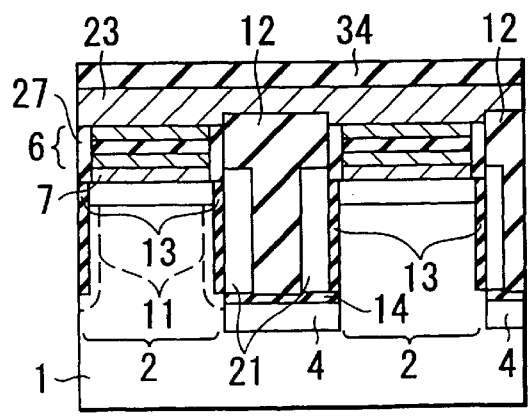
Figure 23B:
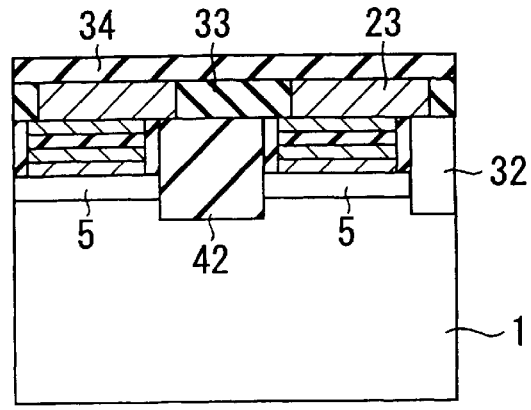

Subsequently, a silicon nitride film 42 is buried and flattened by the CVD process. Next, a silicon oxide film 33 is formed by the CVD process. Subsequently, the mask for forming the bit line 23 is formed by the lithography, the silicon nitride films 32 and 12 are used as the stopper, and the whole silicon oxide film 25 and a part of the capacitor sidewall oxide films 27, 32 and silicon oxide film 33 are etched. Thereby, the upper capacitor electrode layer 10 of the epitaxial capacitor 6 is exposed. Furthermore, after burying and flattening the bit line 23 by sputtering, a silicon nitride film 34 is formed (FIGS. 23A and 23B).

As described above, the memory cell having a memory cell area of 4F² and capacitor area of F² and comprising the completely self-aligned ferroelectric capacitor and vertical field effect transistor can be formed by two lithography processes. Moreover, the memory cell can be connected to the bit line by one lithography process. Furthermore, the effect similar to that of the first embodiment can be produced even in the third embodiment.

Fourth Embodiment

Figure 24:
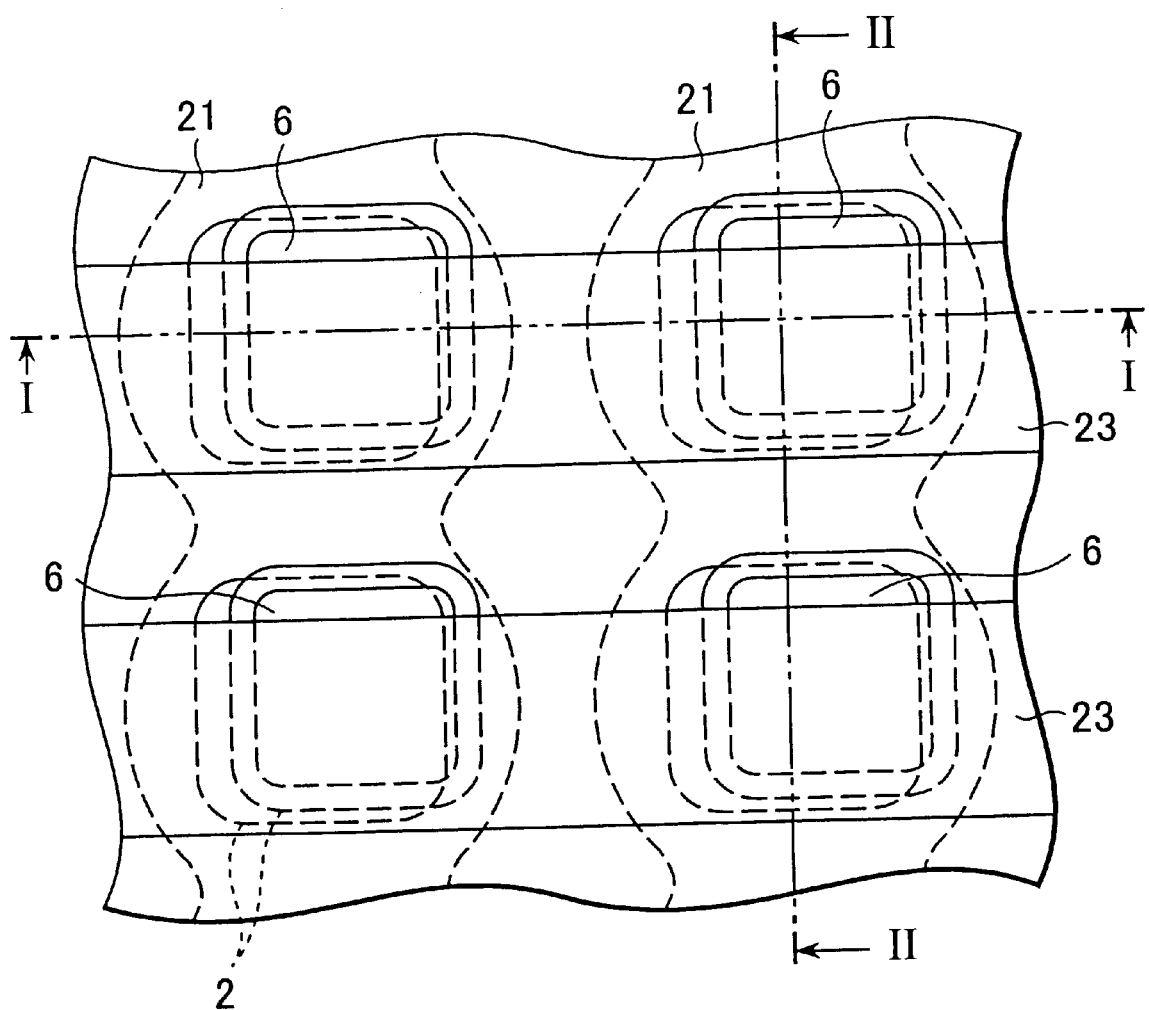
FIG. 24 is a plan view showing four cells of the ferroelectric memory according to a fourth embodiment of the present invention.

FIG. 24 is a plan view of the semiconductor memory device according to a fourth embodiment of the present invention. Here, only 2×2 memory cells are shown in which the ferroelectric capacitor and vertical field effect transistor are used. In the fourth embodiment, the vertical field effect transistor is first formed on the semiconductor substrate and an amorphous insulating film is buried. Subsequently, the single-crystal upper source/drain region of the vertical field effect transistor is formed, the region is used as a nucleus (seed layer) and the whole surface of the substrate is coated with the single-crystal semiconductor layer. The layer structure of the epitaxial capacitor epitaxially grown on this single-crystal semiconductor layer is next formed. At least the epitaxial lower capacitor electrode layer and single-crystal semiconductor layer are collectively processed with the same pattern, and the capacitor is separated/insulated.

In FIG. 24, reference numeral 21 denotes the word line, and 23 denotes the bit line crossing at a substantially right angle to the word line 21. In the intersection position of the word line 21 and bit line 23, the ferroelectric epitaxial capacitor 6 is formed, and the vertical field effect transistor is formed under the capacitor.

A manufacturing method of the semiconductor memory device will next be described with reference to FIGS. 25 to 30 (with the suffixes A, B). In FIGS. 25 to 30, the view with the suffix A corresponds to a sectional view taken along line I—I of FIG. 24, and the view with the suffix B corresponds to a sectional view taken along line II—II of FIG. 24.

First, as shown in FIGS. 25A and 25B, the first conductivity type silicon single-crystal substrate 1 is patterned by the lithography and reactive ion etching, and the semiconductor columnar portion 2 is formed. Additionally, the interval between the columnar portions 2 is formed to be slightly broader than the minimum processed size F in the section shown in FIG. 25A, and the interval is set to F in FIG. 25B.

Subsequently, by the ion implantation and the activation through the heat treatment, the second conductivity type impurity layer 5 (later forming the upper source/drain region of the vertical field effect transistor) is formed on the semiconductor columnar portion 2, and simultaneously the second conductivity type impurity layer 4 (later forming the lower source/drain region of the vertical field effect transistor) is formed between the semiconductor columnar portions 2 in the self-aligning manner.

Subsequently, the buried insulating film 14 (silicon oxide film) is formed on the impurity layer 4 between the semiconductor columnar portions 2. Next, the sacrificial oxide film is formed on the sidewall of the semiconductor columnar portion 2 with silicon exposed thereon in the oxygen or water vapor atmosphere at 1050° C. by RTO. The film is etched and removed with hydrofluoric acid, and the process-damaged layer present on the surface of the transistor channel layer is thereby removed. Thereafter, the gate insulating film 13 is formed anew by BOX at 800° C. (FIGS. 25A and 25B).

Subsequently, as shown in FIGS. 26A and 26B, the second conductivity type semiconductor layer is uniformly formed on the semiconductor substrate 1 by the CVD process. The semiconductor layer is anisotropically etched back and the word line 21 (later forming the gate electrode of the vertical field effect transistor) is formed.

Additionally, in this process, since the interval between the columnar portions 2 is set to be slightly larger than the minimum processed size F in the section shown in FIG. 26A, the word line 21 is separated into two lines extending along the left and right columnar portions 2. On the other hand, since the interval between the memory cells is set to the minimum processed size F in the section shown in FIG. 26B, the groove between the columnar portions 2 is completely filled with the semiconductor layer, and the word line 21 is continuously formed. Subsequently, after the interlayer insulating film 12 (silicon oxide film) is buried in the semiconductor columnar portion 2, the surface of the layer is flattened.

In this process, the vertical field effect transistor is formed comprising: the second conductivity type impurity layer 5 (upper source/drain region) formed on the semiconductor columnar portion 2; second conductivity type impurity layer 4 (lower source/drain region) formed between the semiconductor columnar portions 2; gate insulating film 13 formed on the sidewall of the semiconductor columnar portion 2; and the channel portion 11 extending along the side surface of the columnar portion 2 of the semiconductor.

Subsequently, as shown in FIGS. 27A and 27B, immediately after etching the upper surface of the upper source/drain region 5 with hydrofluoric acid, the substrate surface is cleaned with deoxygenated ultra high purity water and subjected to hydrogen termination. A second conductivity type amorphous silicon layer is next formed on the whole surface of the silicon substrate 1, and subjected to the heat treatment at 500° C. The silicon single-crystal surface of the upper source/drain region 5 is used as the nucleus (seed layer), and a single-crystal silicon layer 35 is epitaxially grown in a solid phase from the interface between the upper source/drain region 5 and the amorphous silicon layer and then flattened.

Figure 28A:
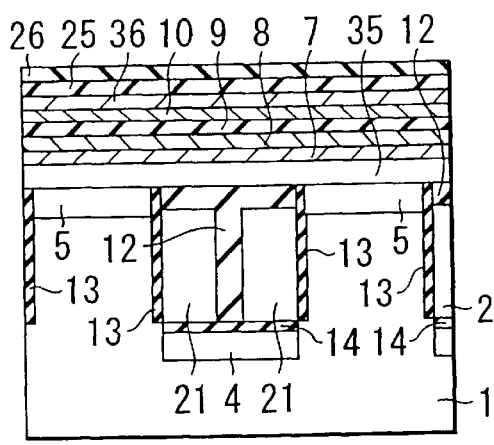
Figure 28B:
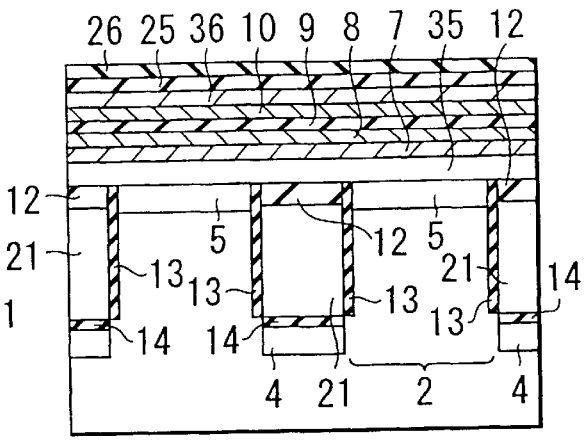

Subsequently, as shown in FIGS. 28A and 28B, immediately after etching the surface of the single-crystal silicon layer 35 with hydrofluoric acid, the surface is cleaned with deoxygenated ultra high purity water and subjected to hydrogen termination. Next, the lower barrier layer 7 of $(Ti_{0.9}, Al_{0.1})N$, lower capacitor electrode layer 8 of $SrRuO_3$, ferroelectric film 9 of $BaTiO_3$, upper capacitor electrode layer 10 of $SrRuO_3$, and an upper barrier layer 36 of $(Ti_{0.9}, Al_{0.1})N$ are epitaxially grown in order on the single-crystal silicon layer 35 by the sputtering process. In any case the substrate temperature is 600° C. Thereafter, the silicon oxide film 25 and silicon nitride film 26 are formed on the upper barrier layer 36 by the CVD process.

Figure 29A:
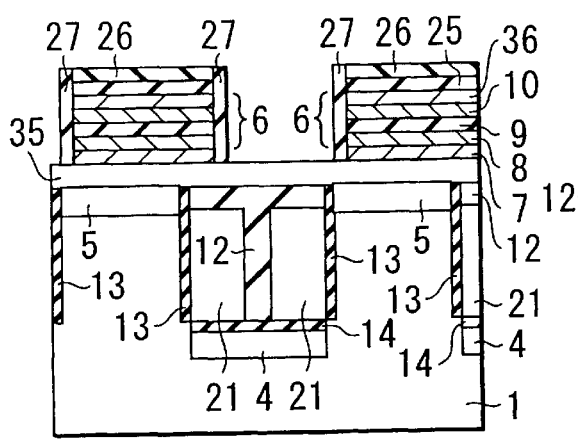
Figure 29B:
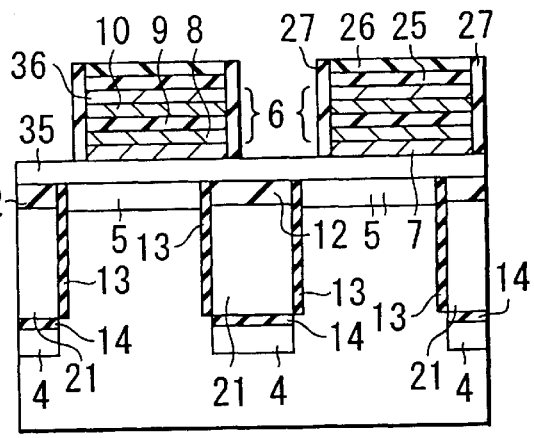

Subsequently, as shown in FIGS. 29A and 29B, by the lithography and reactive ion etching, the lower barrier layer 7, lower capacitor electrode layer 8, ferroelectric film 9, upper capacitor electrode layer 10, upper barrier layer 36, silicon oxide film 25, and silicon nitride film 26 are patterned to the single-crystal silicon layer 35 on the semiconductor substrate 1, and the individual epitaxial capacitors 6 are formed.

Subsequently, after forming the silicon oxide film by the CVD process, the silicon nitride film 26 and single-crystal silicon layer 35 are used as the stop layer and anisotropic etching is performed so that the capacitor sidewall insulator 27 is formed (FIGS. 29A and 29B).

Figure 30A:
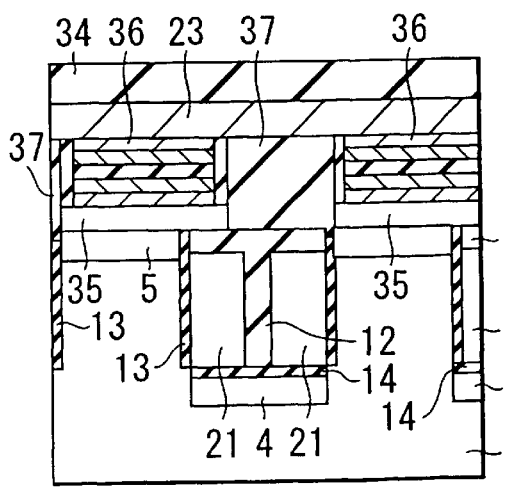
Figure 30B:
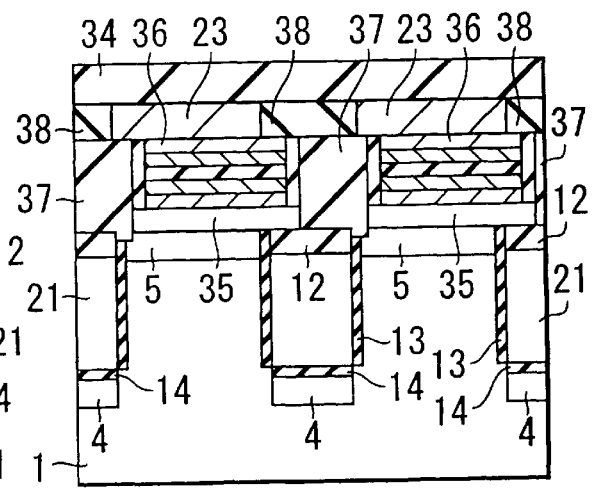

Subsequently, as shown in FIGS. 30A and 30B, the silicon oxide film 25 and capacitor sidewall oxide film 27 including the individual epitaxial capacitors 6 thereunder are used as the mask, and the single-crystal silicon layer 35 is selectively etched. A cell node formed of the lower capacitor electrode layer 8, lower barrier layer 7, single-crystal silicon layer and upper source/drain region 5 is thereby insulatively separated. In this process, the silicon nitride film 26 is also etched.

Subsequently, a silicon oxide film 37 is formed by the CVD process, and the (Ti, Al)N upper barrier layer 36 is used as the stopper and polished by a chemical mechanical polishing process (CMP) and flattened, until the surface of the barrier layer 36 is exposed. A silicon nitride film 38 is next formed by the CVD process, the bit line forming mask is formed by the lithography, and the silicon nitride film 38 is selectively etched using the silicon oxide film 36 as the stopper. Furthermore, the bit line 23 is sputtered, buried, and flattened. Additionally, the silicon nitride film 34 is formed as the protective film (FIGS. 30A and 30B).

In the aforementioned process, the memory cell formed of the ferroelectric capacitor and vertical field effect transistor can be formed by two lithography processes. Furthermore, the memory cell can be connected to the bit line by one lithography process.

In the fourth embodiment, the single-crystal portion on the surface of the upper source/drain region in the vertical field effect transistor is used as the nucleus, and the epitaxial semiconductor layer is epitaxially grown. In this case, since the epitaxial semiconductor layer is also epitaxially grown in a lateral direction, the epitaxial grown film can spread in a lateral direction from the upper source/drain region. The epitaxial semiconductor layer is used as the underlayer film and the epitaxial capacitor is formed. Therefore, even when there is little aligning error during patterning, a sufficiently large epitaxial capacitor (e.g., area of $F^2$) can be formed.

Additionally, in the first to third embodiments, the vertical field effect transistor forming method comprises using the epitaxial capacitor as the mask to pattern the semiconductor columnar portion, and subsequently preparing the vertical field effect transistor. Therefore, the method is limited to the method of forming the vertical field effect transistor on the patterned semiconductor columnar portion. However, in the fourth embodiment, after forming the columnar portion, the epitaxial capacitor is formed. Therefore, instead of patterning and forming the columnar portion, the portion may be formed by a selective epitaxial growth.

Moreover, as the dielectric film of the epitaxial capacitor for use in the first to fourth embodiments, a ferroelectric film mainly containing $BaTiO_3$ is preferable because the film has a stable capacitor property and is easily epitaxially grown. Furthermore, a single-crystal film of conductive oxide having the same perovskite structure as that of the ferroelectric film, such as $SrRuO_3$ and $Sr(Ti, Nb)O_3$ is used in the upper and lower capacitor electrode layers, and a difference in lattice constant between the electrode and the ferroelectric film is utilized to artificially strain the film. An epitaxial strained lattice ferroelectric film formed in this manner is preferably used.

In this case, the $BaTiO_3$ based epitaxial strained lattice ferroelectric film can form a very superior ferroelectric capacitor having a remanent polarization of 60 $\mu C/cm^2$ or more and operation voltage of 1V or less in the self-aligning manner with respect to the vertical field effect transistor.

Moreover, in the present invention, when a paraelectric material of the (Ba, Sr)$TiO_3$ based epitaxial strained lattice film (the film can be paraelectrified by selecting a composition ratio of Sr to Ba) is used, the material can be used as the paraelectric film of the capacitor for use in DRAM. In this case, a very superior paraelectric capacitor having a dielectric constant of 1000 or more and film thickness of 0.1 nm or less in terms of the thickness of the silicon oxide film can be formed in the self-aligning manner with respect to the vertical field effect transistor.

Fifth Embodiment

In the first to fourth embodiments, the $BaTiO_3$ based epitaxial strained lattice ferroelectric film was used as the ferroelectric film of the ferroelectric capacitor, the line and space were processed with substantially the minimum processed size F, and the ferroelectric memory having a memory cell area of about $4F^2$ and capacitor area of $F^2$ was prepared.

Even in this case, with a progress of processing technique, for example, when the processed size F is 0.1 $\mu$m or less, there is a fear that an accumulated charge amount necessary for the memory cell runs short. Concretely, it is assumed that the charge amount necessary for the memory cell is 20 fC in order to ensure stable reading. Even when the ferroelectric capacitor having a remanent polarization of 60 $\mu C/cm^2$ is used, the charge amount is only 6fC with a capacitor area 1 $\mu m^2$. There is a fear that a stable reading operation cannot be performed.

To solve the problem, in a fifth embodiment, the memory cell according to the first to fourth embodiments is used to form the ferroelectric memory which can steadily operate even with the processed size F of 0.1 $\mu$m or less. A circuit constitution of the ferroelectric memory will be described hereinafter.

Figure 31:
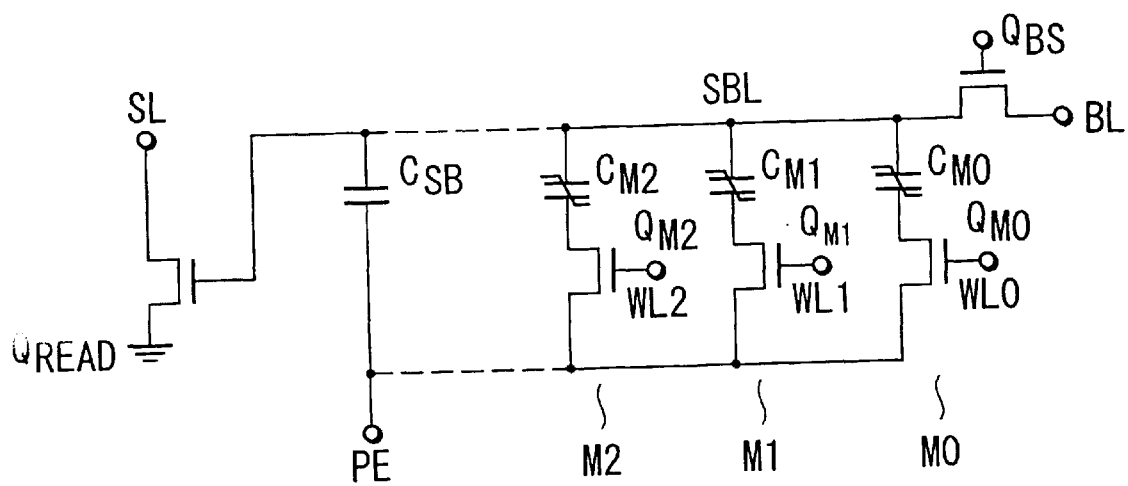
FIG. 31 is a circuit diagram showing a sub-block of the ferroelectric memory according to a fifth embodiment of the present invention.

FIG. 31 is a circuit diagram of the ferroelectric memory. In respective memory cells M0, M1, M2, lower electrodes of ferroelectric capacitors $C_{M0}$, $C_{M1}$, $C_{M2}$ are connected to vertical field effect transistors $Q_{M0}$, $Q_{M1}$, $Q_{M2}$, and the upper capacitor electrode layers are connected to a sub-bit line SBL. One end of the sub-bit line SBL is connected to the gate electrode of an amplifying transistor $Q_{READ}$. An output of the amplifying transistor $Q_{READ}$ is connected to a reading line SL.

Such sub-blocks are arranged in a matrix shape as described later and shown in FIG. 32 to constitute the semiconductor memory. With the usual bit line, when the number of memory cells connected to the line increases, a bit line capacitance also increases. However, when the sub-blocks are constituted and the number of memory cells connected to the sub-bit line SBL decreases, the bit line capacitance can be far smaller than the usual bit line capacitance. The accumulated charge of each of the memory cells M0, M1, M2 is read through the reading line SL after the amplifying transistor $Q_{READ}$ turns on. Therefore, even when the accumulated charge of each of the memory cells M0, M1, M2 is remarkably small, a small number of memory cells are connected to the sub-bit line SBL. Therefore, the accumulated charge can be read by the amplifying transistor $Q_{READ}$.

Moreover, the number of memory cells connected to the sub-bit line SB is adjusted in accordance with the accumulated charge amount of the memory cells M0, M1, M2, and the sub-bit line capacitance is optimized, so that an optimum call signal can be obtained.

Furthermore, when the same structure as that of the vertical field effect transistor used in the memory cells M0, M1, M2 is used in the amplifying transistor $Q_{READ}$, a manufacturing process can be shared therebetween, and layout design of the memory cell can also be optimized.

To the memory cell constituted by connecting the ferroelectric capacitor to the vertical field effect transistor, in which the $BaTiO_3$ based epitaxial strained lattice dielectric film described in the first to fourth embodiments is used, the memory circuit using the sub-bit line SBL and amplifying transistor $Q_{READ}$ described in the fifth embodiment is preferably applied. Only in this case, an ultra high integrated semiconductor memory device of 4 Gbit to 16 Gbit can be realized.

Figure 32:
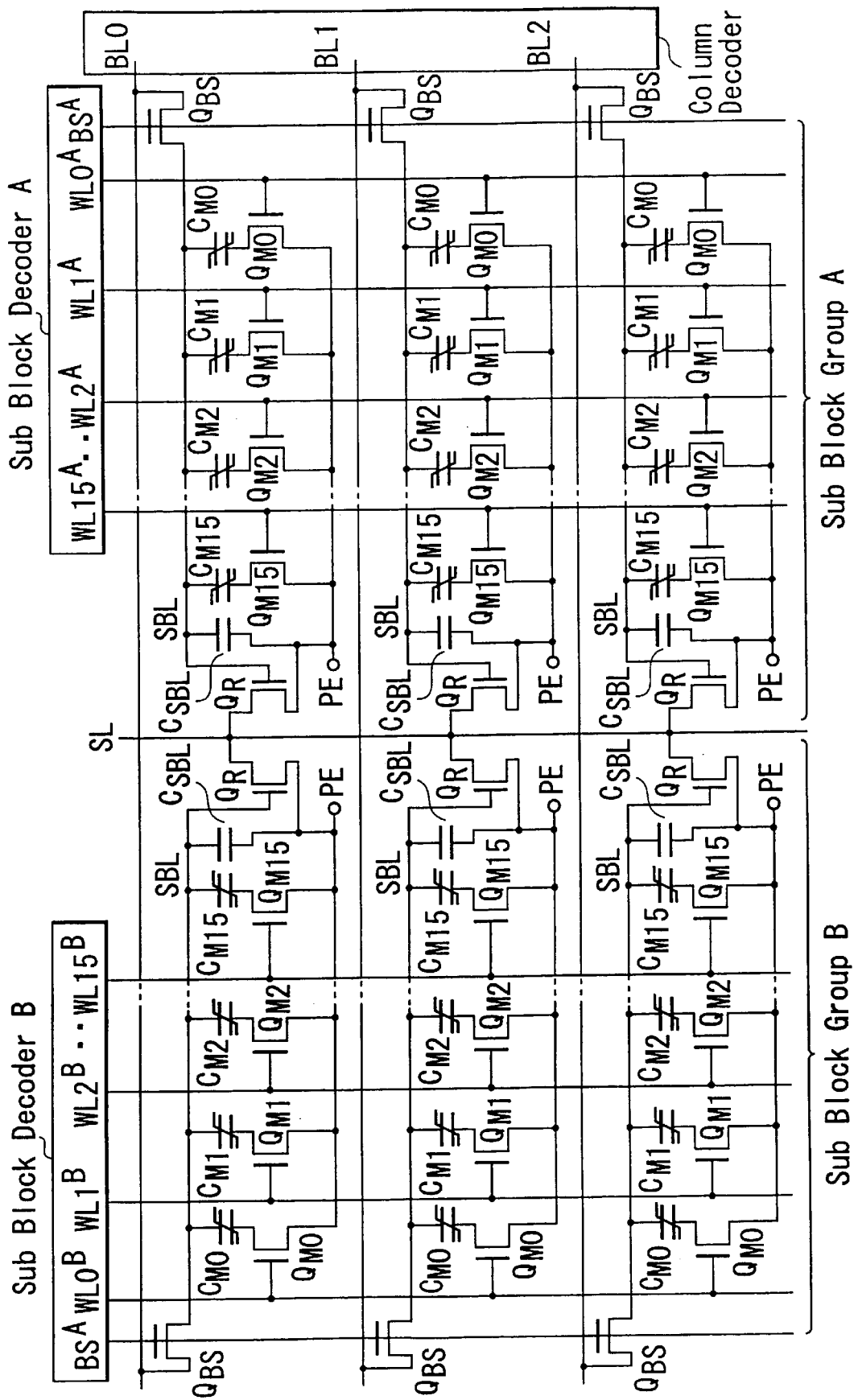
FIG. 32 is a circuit diagram showing a cell array constitution of the ferroelectric memory according to the fifth embodiment.

FIG. 32 is a circuit diagram of the ferroelectric memory in which six memory cell sub-blocks described with reference to FIG. 31 are arranged in a matrix shape.

As shown in FIG. 32, in sub-blocks A, B, the sub-bit line SBL is connected to the memory cell comprising a plurality of vertical field effect transistors $Q_{M0}, Q_{M1}, Q_{M2}, \ldots, Q_{M15}$, and a plurality of ferroelectric capacitors $C_{M0}, C_{M1}, C_{M2}, C_{M3}, \ldots, C_{M15}$ whose lower capacitor electrode layer is connected to the upper source/drain region of the vertical field effect transistor. These sub-blocks are arranged in the matrix shape to constitute the memory cell.

The lower source/drain region of the vertical field effect transistors $Q_{M0}, Q_{M1}, Q_{M2}, \ldots, Q_{M15}$ is connected to a plate electrode. The upper capacitor electrode layer of the ferroelectric capacitors $C_{M0}, C_{M1}, C_{M2}, \ldots, C_{M15}$ is connected to the sub-bit line SBL of each block.

In this case, as described in the first to fourth embodiments, in the memory cell, each of the ferroelectric capacitors $C_{M0}, C_{M1}, C_{M2}, \ldots, C_{M15}$ comprises the epitaxially grown lower capacitor electrode layer, ferroelectric film and upper capacitor electrode layer, and formed on the vertical field effect transistor in the self-aligning manner.

Moreover, a case in which each sub-bit line SBL is connected to 16 memory cells has been described herein. However, needless to say, the number of memory cells connected to the sub-bit line can appropriately be increased/decreased in accordance with the remanent polarization of the ferroelectric capacitor.

One end of each sub-bit line SBL is connected to the gate electrode of an amplifying transistor $Q_R$. The lower source/drain region of each amplifying transistor $Q_R$ is connected to the plate electrode. The upper source/drain region is connected to the reading line SL. Here, the sub-bit line SBL is connected to a storage capacitance $C_{SBL}$.

Moreover, the other end of the sub-bit line SBL is connected to one source/drain electrode of a sub-block selecting transistor $Q_{BS}$, and the other source/drain electrode of the sub-block selecting transistor $Q_{BS}$ is connected to a bit line BL.

Furthermore, a plurality of memory cell rows connected to the sub-bit lines SBL are arranged in the matrix shape, and a right sub-block group A is arranged symmetrically with a left sub-block group B centering on one reading line SL.

Respective gate electrodes of the vertical field effect transistors $Q_{M0}, Q_{M1}, Q_{M2}, \ldots, Q_{M15}$ belonging to the sub-blocks of the sub-block group A are connected to word lines $WL0^A, WL1^A, WL2^A, \ldots, WL15^A$. Moreover, the respective gate electrodes of the vertical field effect transistors $Q_{M0}, Q_{M1}, Q_{M2}, \ldots, Q_{M15}$ belonging to the sub-blocks of the sub-block group B are connected to word lines $WL0^B, WL1^B, WL2^B, \ldots, WL15^B$.

Moreover, the gate electrode of the selecting transistor $Q_{BS}$ of the sub-block group A is connected to a sub-block selecting line $BS^A$, and the gate electrode of the selecting transistor $Q_{BS}$ of the sub-block group B is connected to a sub-block selecting line $BS^B$.

The respective word lines $WL0^A, WL1^A, WL2^A, \ldots, WL15^A$ belonging to the sub-block group A are connected to a row decoder A. Moreover, the respective word lines $WL0^B, WL1^B, WL2^B, \ldots, WL15^B$ belonging to the sub-block group B are connected to a row decoder B. Furthermore, the source/drain electrodes of the respective selecting transistor $Q_{BS}$ of the symmetrically arranged sub-blocks are connected to common bit lines BL0, BL1, . . . , and to a column decoder.

In the ferroelectric memory connected in this manner, a coordinate (X, Y) is indicated in the intersection of a bit line BLX (X=0, 1) and word line $WLY^A$ (Y=0, 1, 2, . . . , 15) which belong to the sub-block group A. A case in which the memory cell of the certain coordinate is selected will be described.

First the word line of $BS^A$ is set to "1" (high level) to turn on the sub-block selecting transistor $Q_{BS}$, and next the word line $WLY^A$ is set to "1" (high level) to turn on a vertical field effect transistor $Q_{MY}$ of the Y coordinate memory cell. Subsequently, when a potential is applied to the bit line BLX with respect to a plate electrode PE having a constant potential (e.g., ½ Vcc), the memory cell positioned in the coordinate (X, Y) can be selected.

A desired memory cell indicated in the intersection of the bit line BLX (X=0, 1) and word line $WLY^B$ (Y=0, 1, 2, . . . 15) belonging to the sub-block group B can be selected similarly as described above.

A reading/writing procedure of the ferroelectric memory shown in FIG. 32 will be described based on timing charts of FIGS. 33 and 34.

Figure 33:
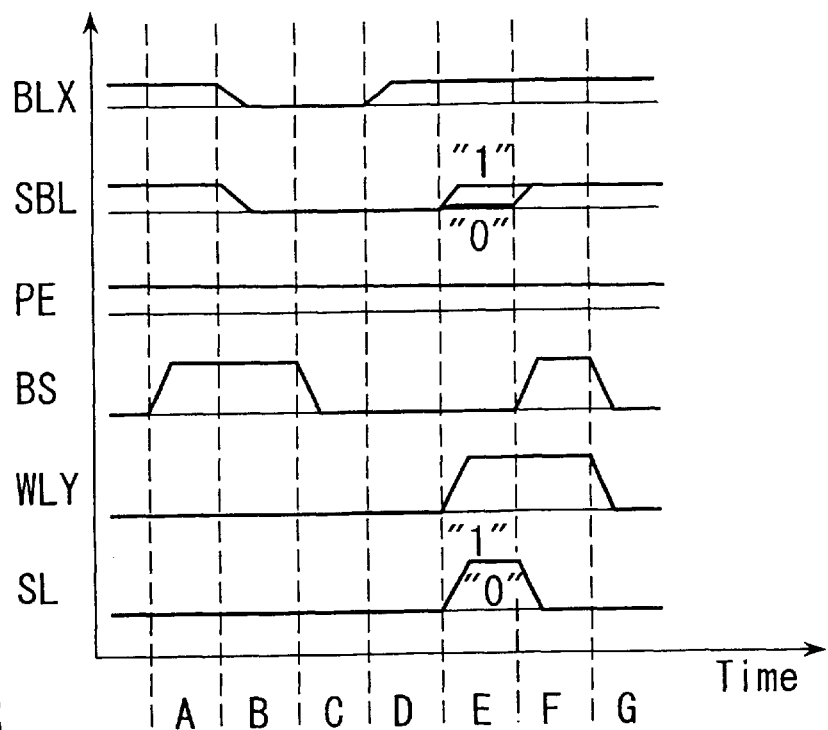
FIG. 33 is a timing chart showing a reading sequence of the ferroelectric memory according to the fifth embodiment.
Figure 34:
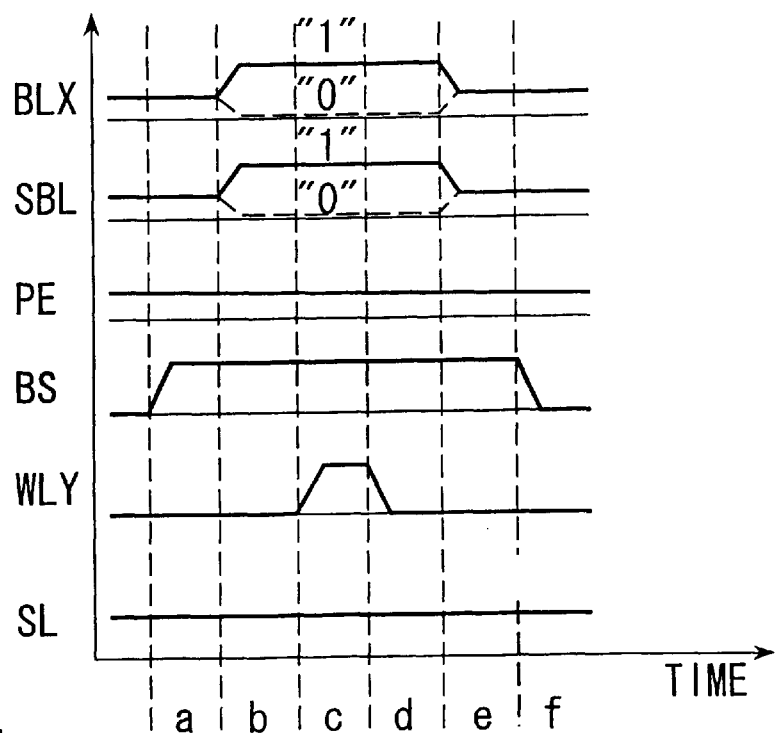
FIG. 34 is a timing chart showing a writing sequence of the ferroelectric memory according to the fifth embodiment.

First, as shown in FIG. 33, during reading, the sub-block selecting word line BS is set to the high level, and the sub-block selecting transistor $Q_{BS}$ is turned on. In this case, a constant voltage is applied to the bit line $BL_X$, and a reading voltage is applied to the sub-bit line SBL (sequence A).

Subsequently, the bit line $BL_X$ is set to the low level, and the sub-bit line is pre-charged (sequence B). Next, the sub-block selecting word line BS is set to the low level, the transistor $Q_{BS}$ is turned off, the sub-block is disconnected, and the sub-bit line SBL is brought to a floating state (sequence C). Subsequently, the voltage of the bit line $BL_X$ is returned to the constant voltage (sequence D).

Subsequently, the word line $WL_Y$ is selected, and the vertical field effect transistor $Q_{MY}$ connected to the word line $WL_Y$ is turned on. In this manner, the pre-charged sub-bit line SBL is electrically connected to a storing ferroelectric capacitor $C_{MY}$ connected to the vertical field effect transistor $Q_{MY}$. The pre-applied voltage is added to the storing ferroelectric capacitor $C_{MY}$ to reverse the polarization. In this case, the sub-bit line SBL indicates a different potential, that is, a high or low potential due to a polarization direction stored beforehand in the storing ferroelectric capacitor $C_{MY}$. This value "1" or "0" is read by the amplifying transistor $Q_{READ}$ and outputted to the reading line SL. Information of the memory cell of the coordinate (X, Y) can be read in this manner (sequence E).

Subsequently, the sub-block selecting word line BS turns to the high level, and the sub-bit line is connected to the bit line (sequence F). The sub-block selecting word line BS and word line $WL_Y$ next turn to the low level, and the reading thereby ends (sequence G).

Writing will next be described with reference to FIG. 34.

First, the sub-block selecting word line BS is turned on, and the sub-block selecting transistor $Q_{BS}$ is turned on (sequence a). Subsequently, a voltage necessary for reversing a polarity of the memory cell ferroelectric film is applied in accordance with the information to be stored in the bit line BL ("1" or "0"), and a writing voltage is thereby applied to the sub-bit line SBL (sequence b).

Subsequently, the word line $WL_Y$ is selected, and thereby the vertical field effect transistor $Q_{MY}$ connected to the word line $WL_Y$ is turned on. The ferroelectric capacitor CMY is then connected to the sub-bit line SBL, the voltage is applied to the line in accordance with the information, and the polarization direction of the ferroelectric film is determined (sequence G).

The word line $WL_Y$ is next deactivated, and the cell is disconnected (sequence d). Subsequently, the bit line is returned to the original state (sequence e). Thereafter, the sub-block selecting word line BS turns to the low level, the block is disconnected, and the writing ends (sequence f).

Figure 35A:
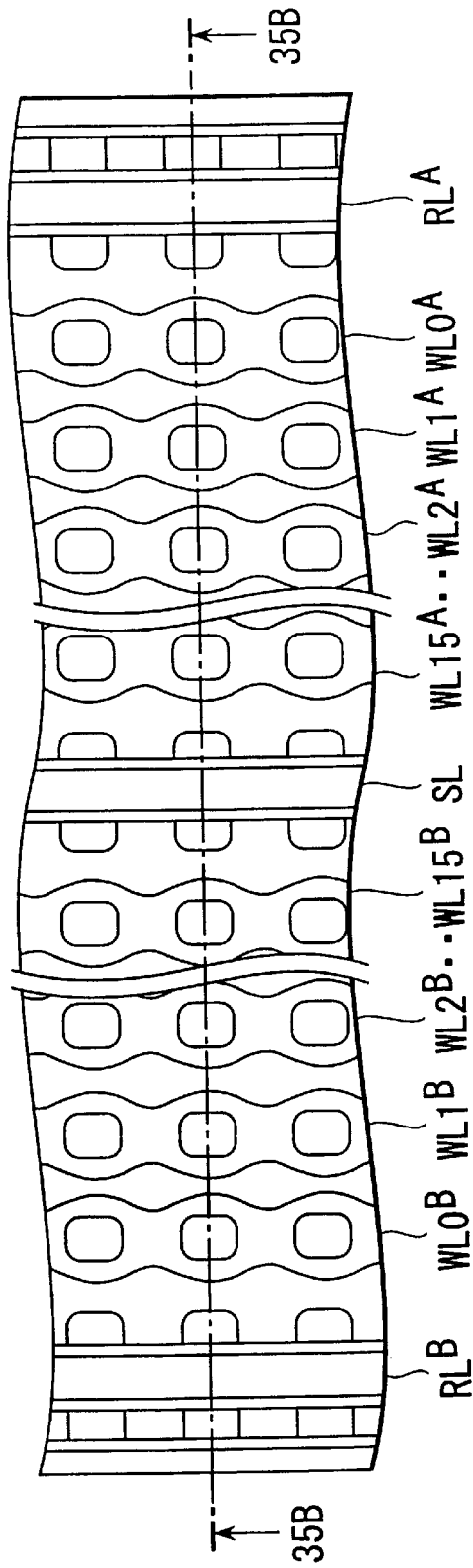
FIGS. 35A and 35B are a plan view and sectional view of the ferroelectric memory according to the fifth embodiment.
Figure 35B:
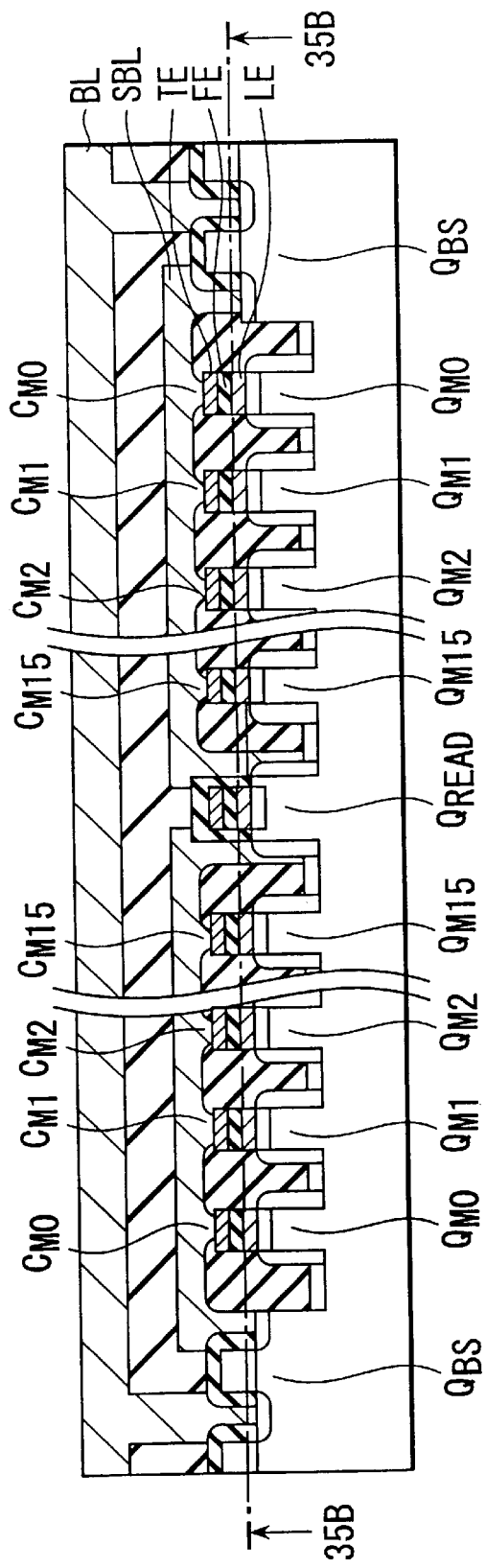

FIGS. 35A and 35B are a plan view and sectional view of the ferroelectric memory shown in FIG. 32. FIG. 35A is a plan view taken along line 35A—35A of FIG. 35B, and FIG. 35B is a sectional view taken along line 35B—35B of FIG. 35A. The same symbols as those in FIG. 32 are used.

Two sub-blocks are grounded in one block connected to the bit line BL, and each sub-block includes 16 memory cells, sub-block selecting transistor $Q_{BS}$ and amplifying transistor $Q_{READ}$.

Moreover, the respective selecting transistors $Q_{M0}$, $Q_{M1}$, $Q_{M2}$, . . . , $Q_{M15}$ are vertical field effect transistors. The ferroelectric capacitors $C_{M0}$, $C_{M1}$, $C_{M2}$, . . . , $C_{M15}$ including a lower capacitor electrode layer LE, ferroelectric film FE and upper capacitor electrode layer TE are formed on the upper source/drain region of the selecting transistors $Q_{M0}$, $Q_{M1}$, $Q_{M2}$, . . . , $Q_{M15}$. Furthermore, the amplifying transistor $Q_{READ}$ connected to one end of the sub-bit line SBL is also a vertical field effect transistor, and the sub-block selecting transistor $Q_{BS}$ connected to the other end of the sub-bit line SBL is a usual planar field effect transistor.

In the present embodiment, since the width of the memory cell in the word line direction is 2 F and the length thereof in the bit line direction is 2.3 F, the area of the memory cell is 4.6 $F^2$. Since the area of the region other than the memory cell per block is 16 $F^2$, the area per memory cell is $(4.6+16/32)$ $F^2$.

Moreover, the ferroelectric capacitor having a remanent polarization of 60 $\mu C/cm^2$ is used in the present embodiment. Therefore, it is seen that the memory can steadily operate even with eight memory cells connected to each sub-bit line. Therefore, a size of 5.1 $F^2$ per memory cell is realized. An operation of a very high integrated nonvolatile memory can be realized by this circuit constitution.

As described above in detail, the epitaxial capacitor can be formed on the upper source/drain region of the vertical transistor in the self-aligning manner. Therefore, the area of the transistor substantially agrees with that of the capacitor and the memory cell having an area of 4 $F^2$ at minimum can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor memory device, comprising:

forming a first impurity region on a surface of a single-crystal semiconductor layer provided on a main surface of a substrate, to form one of source and drain regions of a vertical field effect transistor;

epitaxially growing a stacked film comprising a lower capacitor electrode layer, a ferroelectric film and an upper capacitor electrode layer in this order on the first impurity region;

patterning the lower capacitor electrode layer, the ferroelectric film and the upper capacitor electrode layer in a desired shape, to form a plurality of capacitors;

selectively removing the single-crystal semiconductor layer in such a manner that the single-crystal semiconductor layer under the plurality of capacitors remains, to form a plurality of single-crystal semiconductor columnar portions under the plurality of capacitors;

forming a second impurity region on the single-crystal semiconductor layer adjoining to a lower portion of each of the plurality of columnar portions, the second impurity region being the other of the source and drain regions of the vertical field effect transistor;

forming a gate insulating film on a sidewall of each of the plurality of columnar portions;

forming a gate electrode on the sidewall via the gate insulating film, to form the vertical field effect transistor in which the columnar portion is a channel portion.

2. The manufacturing method according to claim 1, wherein the forming of the plurality of single-crystal semiconductor columnar portions comprises setting an interval between the single-crystal semiconductor columnar portions adjacent to each other in an extending direction of a bit line to be larger than an interval between the single-crystal semiconductor columnar portions adjacent to each other in the extending direction of a word line, which crosses the bit line at a substantially right angle.

3. The manufacturing method according to claim 1, further comprising forming a barrier layer on the first impurity layer, before epitaxially growing the stacked film.

4. The manufacturing method according to claim 1, further comprising, after forming the plurality of capacitors, forming an interlayer insulating film on respective sidewalls of the plurality of capacitors.

5. The manufacturing method according to claim 1, wherein the forming of the plurality of vertical field effect transistors includes forming of the plurality of vertical field effect transistors in a self aligning manner with the plurality of capacitors.

6. A manufacturing method of a semiconductor memory device, comprising:

forming a plurality of single-crystal semiconductor columnar portions in a substantially perpendicular direction with respect to a surface of a single-crystal semiconductor layer provided on a main surface of a substrate;

forming a gate insulating film on respective side surfaces of the plurality of columnar portions;

forming a gate electrode on the respective side surfaces of the plurality of columnar portions via the gate insulating film;

forming a first region functioning as one of a source and a drain on respective tops of the plurality of columnar portions;

forming a second region functioning as the other of the source and the drain on the single-crystal semiconductor layer adjoining to respective bottom portions of the plurality of columnar portions;

filling the plurality of columnar portions with an insulating layer, followed by flattening and exposing the respective tops of the plurality of columnar portions;

growing an epitaxial semiconductor layer using a single-crystal semiconductor surface of the first impurity region formed on the respective tops of the plurality of columnar portions;

epitaxially growing a stacked film comprising a lower capacitor electrode layer, a ferroelectric film and an upper capacitor electrode layer in this order on the epitaxial semiconductor layer; and collectively patterning the stacked film and the epitaxial semiconductor layer, to form a plurality of capacitors.

7. The manufacturing method according to claim 6, wherein the forming of the plurality of single-crystal semiconductor columnar portions comprises setting an interval between the single-crystal semiconductor columnar portions adjacent to each other in an extending direction of a bit line to be larger than an interval between the single-crystal semiconductor columnar portions adjacent to each other in an extending direction of a word line, which crosses the bit line at a substantially right angle.

8. The manufacturing method according to claim 6, further comprising forming a barrier layer on the epitaxial semiconductor layer, before epitaxially growing the stacked film.

* * * * *